US007642769B2

(12) United States Patent
Osakabe

(10) Patent No.: US 7,642,769 B2
(45) Date of Patent: Jan. 5, 2010

(54) INSERT AND TRAY FOR ELECTRONIC DEVICE HANDLING APPARATUS, AND ELECTRONIC DEVICE HANDLING APPARATUS

(75) Inventor: Akihiro Osakabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 575 days.

(21) Appl. No.: 11/254,229

(22) Filed: Oct. 20, 2005

(65) Prior Publication Data

US 2008/0186015 A1    Aug. 7, 2008

Related U.S. Application Data

(63) Continuation of application No. PCT/JP2004/005519, filed on Apr. 16, 2004.

(30) Foreign Application Priority Data

Apr. 23, 2003    (WO) .................. PCT/JP03/05182

(51) Int. Cl.
*G01R 31/28* (2006.01)
*H01L 23/58* (2006.01)
*H01R 12/00* (2006.01)
*H01R 13/62* (2006.01)
*H05K 1/00* (2006.01)

(52) U.S. Cl. .................. 324/158.1; 257/48; 439/59; 439/60; 439/62; 439/64; 439/330; 439/331

(58) Field of Classification Search .............. 324/158.1; 257/48; 439/59–62, 64, 330, 331
See application file for complete search history.

(56) References Cited

U.S. PATENT DOCUMENTS

| 5,331,608 | A | | 7/1994 | Umemoto et al. |
|---|---|---|---|---|
| 5,389,820 | A | * | 2/1995 | Matsuoka .................. 257/727 |
| 5,629,632 | A | * | 5/1997 | Tsutsumi .................. 324/758 |
| 6,304,073 | B1 | * | 10/2001 | Saito ..................... 324/158.1 |
| 6,313,652 | B1 | * | 11/2001 | Maeng ..................... 324/760 |
| 6,821,138 | B2 | * | 11/2004 | Hou ........................ 439/342 |
| 2002/0011863 | A1 | * | 1/2002 | Takahashi et al. .......... 324/760 |

FOREIGN PATENT DOCUMENTS

| JP | A-2001-033518 | | 2/2001 |
|---|---|---|---|
| JP | 2002025732 | * | 1/2002 |
| JP | A-2002-25732 | | 12/2002 |

OTHER PUBLICATIONS

International Search Report mailed on Aug. 24, 2004 for the counterpart International patent application No. PCT/JP2004/005519.
Office Action dated Aug. 1, 2006 in corresponding Singapore patent application No. 200507433-1.

\* cited by examiner

*Primary Examiner*—Ha Tran T Nguyen
*Assistant Examiner*—Karen M Kusumakar
(74) *Attorney, Agent, or Firm*—Posz Law Group, PLC

(57) ABSTRACT

An insert comprises an insert body having an IC housing part, a drive plate being allowed to move up and down attached to the insert body and a latch being allowed to swing attached to the insert body and having a pressing portion formed at its lower end portion. The latch swings along with the upward/downward move of the drive plate, and the pressing portion of the latch goes out to the IC housing part when the drive plate moves upward and presses an IC device housed in the IC housing part against a sidewall portion of the IC housing part.

12 Claims, 15 Drawing Sheets

(a)

(b)

(a)

(b)

Fig.15 "PRIOR ART"
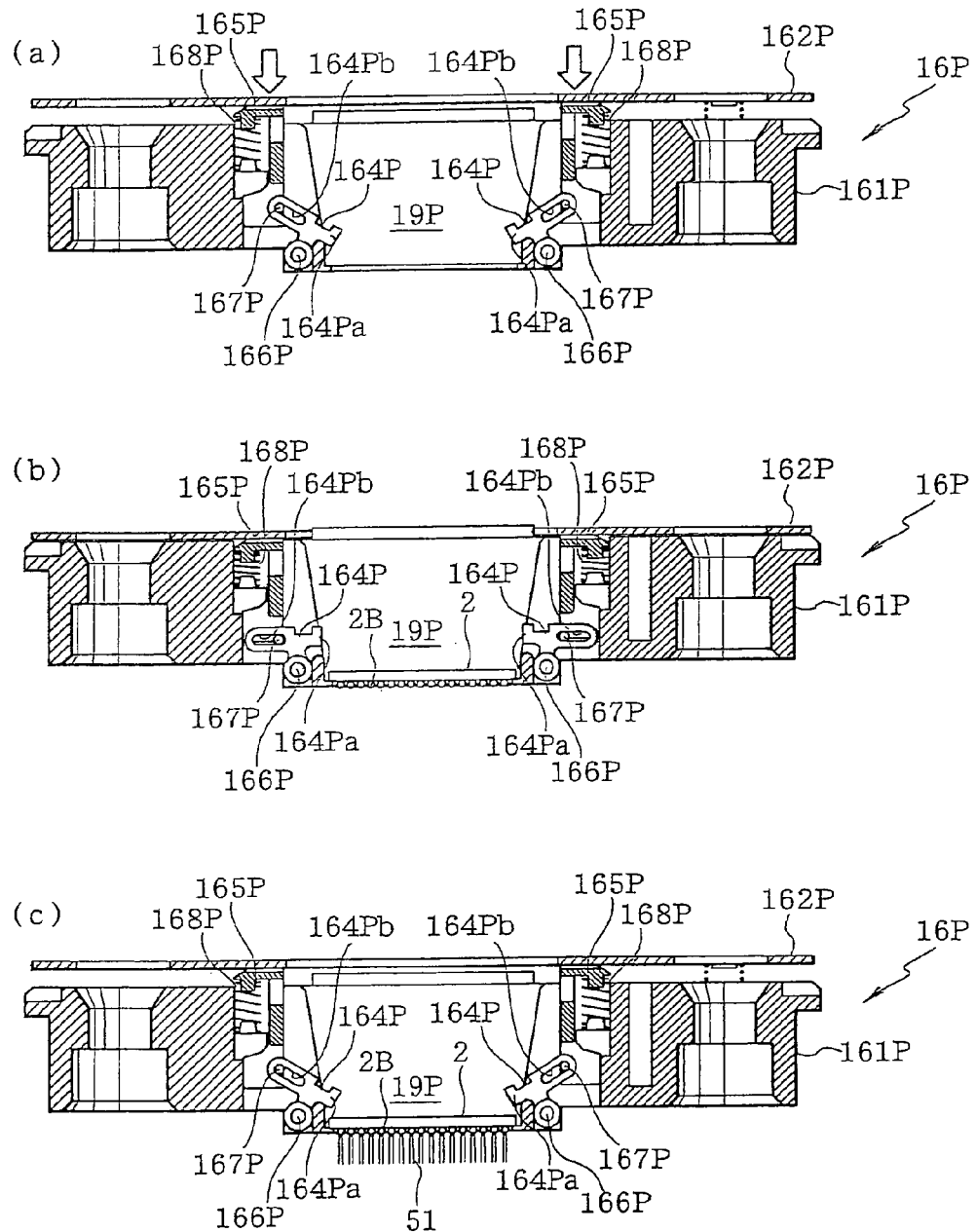

INSERT AND TRAY FOR ELECTRONIC DEVICE HANDLING APPARATUS, AND ELECTRONIC DEVICE HANDLING APPARATUS

TECHNICAL FIELD

The present invention relates to an electronic device handling apparatus capable of handling an electronic device to be tested for conducting a test on the electronic device, such as an IC device and a tray and an insert used for the apparatus, and particularly relates to an insert, a tray and an electronic device handling apparatus capable of reducing arising of a contact error of an electronic device to be tested, abnormal deformation of external terminals, and breaking on a contact portion, etc.

BACKGROUND ART

In a production process of an IC device, etc., a testing apparatus is necessary for testing a finally produced electronic device. In such a testing apparatus, a large number of IC devices are housed in a tray to be conveyed by an electronic device handling apparatus called a handler, and the IC devices are brought to electrically contact a test head and tested by a main testing apparatus (tester). At this time, the IC devices to be tested are pressed against the test head in a state of being held on a test tray. When the test is finished, the electronic device handling apparatus carries out the IC devices from the test head and reloads on trays in accordance with the test results to sort the IC devices to categories, such as good ones and defective ones.

The test tray is attached with, for example, 32 or 64 of IC device holders called inserts, and the IC devices are housed in the inserts and held by latches so as not to jump out from the inserts.

Here, a method of holding an IC device by a conventional insert will be explained. As shown in FIG. 15, an insert 16P comprises an insert body 161P having an IC housing part 19P, a drive plate 162P for covering the insert body 161P, drive members 165P capable of moving up and down on the inert body 161P, and latches 164P capable of swinging in accordance with the upward/downward movement of the drive members 165P.

At the lower end portion of the latch 164P is penetrated by an axis pin 166P provided on both sides of the IC housing part 19P, and the latch 164P can swing about the axis pin 166P. A suppressing tab 164Pa is provided at the end portion of the latch 164P on the IC housing part 19P side, and at the end portion of the latch 164P on the other side of the IC housing part 19P is formed a long hole 164Pb penetrated by a pin 167P being allowed to slide.

The drive member 165P holds the above pin 167P at its lower end portion and is biased upward by a coil spring 168P provided between itself and the inert body 161P.

In such an insert 16P, the drive plate 162P and the drive member 165P position at the upper side in a state with no load as shown in FIG. 15(a), and the suppressing tab 164Pa of the latch 164P is out to the IC housing part 19P.

As shown in FIG. 15(b), when the drive plate 162P of the insert 16P is pressed to move the drive member 165P downward, the pin 167P moves downward along the long hole 164Pb of the latch 164P. Along therewith, the latch 164P swings to the opening direction, and the suppressing tab 164Pa of the latch 164P recedes from the IC housing part 19P.

After placing an IC device 2 in the IC housing part 19P in this state, when the pressure on the drive plate 162P is released, as shown in FIG. 15C, the drive member 165P moves upward, the latch 164P swings to the closing direction, and the suppressing tab 164Pa of the latch 164P goes out to the IC housing part 19P. At this time, the suppressing tab 164Pa of the latch 164P covers the upper surface of the IC device 2, so that the IC device 2 is prevented from jumping out from the IC housing part 19P.

The IC device 2 normally has an error on outer dimensions in each product. Accordingly, the IC housing part 19P has to be formed larger than the maximum values of the outer dimensions of the IC device 2 to surely hold the IC device 2. Therefore, when an IC device 2 with large outer tolerance, particularly an IC device 2 with small outer dimensions, is placed in the IC housing part 19P, a play of the IC device 2 inside the IC housing part 19P becomes large and the possibility of arising a contact error between external terminals 2B of the IC device 2 with probe pins 51 provided on the test head becomes high. Also, when the probe pins 51 stick positions deviated from the center of the external terminals 2B of the IC device 2, the external terminals 2B abnormally deform or the probe pins 51 bend or broke in some cases.

Such a problem has become more serious as the IC devices 2 become more compact and pitches of the external terminals 2B become narrower recently.

Since the latch 164P only covered over the IC device 2 and a function of aligning the IC device 2 was not provided in the conventional insert 16P, the problem could not be solved by the latch 164P.

The Patent Gazette of Japanese patent No. 3294978 discloses an insert (IC carrier) having the same action as that of the above conventional insert 16P, but the insert also has the same problem as the above conventional insert 16P.

DISCLOSURE OF THE INVENTION

The present invention has made in consideration of the above circumstances and has as an object thereof to provide an insert, tray and an electronic device handling apparatus capable of reducing arising of a contact error of an electronic device to be tested, abnormal deformation of external terminals and breaking of a contact portion, etc.

To attain the above object, first, the present invention provide an insert for housing an electronic device to be tested brought to be electrically connected to a contact portion of a test head in an electronic device handling apparatus, comprising an insert body formed with an electronic device housing part for housing the electronic device to be tested and having a contact portion for a side surface of the electronic device to be tested housed in the electronic device housing part to contact; and a pressing member capable of pressing the electronic device to be tested housed in the electronic device housing part against the contact portion of the insert body (invention 1).

In the above insert (invention 1), even in the case where an electronic device to be tested formed to have small outer dimensions by an error is housed in the electronic device housing part, the electronic device to be tested is pressed by the pressing member against the contact portion of the electronic device housing part so as not to play in the electronic device housing part. Therefore, in the case of an electronic device within a normal error range (an electronic device with no excessive error in dimensions from an electronic device side surface to contact with the contact portion to external terminals), the external terminals can be brought to surely contact the contact portion of the test head. Accordingly, it is possible to decrease arising of contact errors due to positional deviation between the external terminals of the electronic device and the contact portion, abnormal deformation as a result that the contact portion sticks a deviated position from the center of the external terminals, and breaking of the contact portion.

In the above invention (invention 1), it is preferable that the pressing member is receded form the electronic device housing part at the time of introducing the electronic device into the electronic device housing part and goes out to the electronic device housing part after the electronic device to be tested is housed in the electronic device housing part (invention 2). Due to the configuration, the electronic device to be tested can be smoothly introduced and housed in the electronic device housing part.

In the above invention (invention 2), alternately, the insert may further comprise a drive being allowed to move up and down attached to the insert body; and the pressing member being allowed to swing is attached to the insert body, which swings to recede from the electronic device housing part or to go out to the electronic device housing part along with a downward move or an upward move of the drive (invention 3). Note that in the later explained embodiment, a drive plate corresponds to the drive here, but the present invention is not limited to this.

In the above invention (invention 3), alternately, the pressing member may comprise a swing arm having a swing axis to be a swing supporting point and a drive contact portion for the drive to contact; a body part extending to the electronic device housing part and connected to the swing arm on the opposite side of the drive contact portion over the swing axis; and a pressing portion provided to the body part and for pressing the electronic device to be tested against the contact portion of the insert body by contacting with the electronic device to be tested housed in the electronic device housing part.

In such a pressing member, when the drive contact portion contacting the drive moves up and down being interlocked with upward and downward moves of the drive, the swing arm swings about the swing axis, and along with that, the pressing portion provided to the body part recedes from the electronic device housing part or goes out to the electronic device housing part to press the electronic device to be tested against the contact portion of the insert body.

A pressing member and a drive having the above configuration can be produced at low costs. Note that the insert of the present invention is not limited to the configuration.

Also, in the above invention (invention 2), alternately, the insert may further comprise a drive being allowed to move up and down attached to the insert body; and the pressing member being allowed to move in parallel in the planar direction is attached to the insert body, which moves in parallel to recede from the electronic device housing part or to go out to the electronic device housing part along with a downward move or an upward move of the drive (invention 5).

In the above invention (invention 5), alternately, a long hole may be formed on the pressing member, the long hole gradually approaches to the electronic device housing part as getting downward, and the drive may be provided with a pin to be inserted, being allowed to slide, to the long hole of the pressing member (invention 6).

In the pressing member as above, when the drive moves downward, the pin slides along the long hole of the pressing member to move downward, consequently, the pressing member moves in parallel to recede from the electronic device housing part. While, when the drive moves upward, the pin slides along the long hole of the pressing portion to move upward, consequently, the pressing member moves in parallel to go out to the electronic device housing part.

A pressing member and a drive having the above configuration can be produced at low costs. Note that the insert of the present invention is not limited to the configuration.

In the above inventions (inventions 3 to 6), it is preferable that the insert body is provided with an elastic body for biasing the pressing member in the direction that the pressing member goes out to the electronic device housing part (invention 7). When configured as above, an operation in the direction that the pressing member goes out to the electronic device housing part can be controlled by an elastic body, and an operation in the direction that the pressing member recedes from the electronic device housing part can be controlled by the drive.

As an elastic body, for example, springs, such as a coil spring, a torsion spring and a plate spring; molded articles of rubber, thermoplastic elastomer and foamed plastic, etc.; a sealed liquid or gas; etc. may be mentioned.

In the above inventions (inventions 1 to 7), alternately, the pressing member may comprise an electronic device suppressing portion being capable of suppressing an upper surface of the electronic device to be tested housed in the electronic device housing part. The pressing member having such an electronic device suppressing portion is capable of preventing the electronic device to be tested housed in the electronic device housing part from jumping out from the electronic device housing part (invention 8).

In the above inventions (inventions 1 to 8), alternately, the pressing member may be provided on one side (invention 9) or on adjacent two sides of the electronic device housing part in the insert body (invention 10). Note that the "side" mentioned in the present specification does not mean a line segment but a spatial portion near the side.

In the above inventions (inventions 9, 10), alternately, an opposing side of the pressing member of the electronic device housing part in the insert body may be provided with an electronic device suppressing member capable of suppressing an upper surface of the electronic device to be tested by receding from the electronic device housing part at the time of introducing the electronic device to be tested into the electronic device housing part and going out to the electronic device housing part after the electronic device to be tested is housed in the electronic device housing part (invention 11). When provided with such an electronic device suppressing member, it is possible to prevent the electronic device to be tested housed in the electronic device housing part from jumping out from the electronic device housing part.

Secondary, the present invention provides a tray for conveying an electronic device to be tested to a contact portion of a test head connected to an electronic device handling apparatus, comprising the insert (inventions 1 to 11) as above (invention 12). The insert is normally detachably attached to the tray, but the present invention is not limited to this and, for example, the tray and the insert may be integrated.

Thirdly, the present invention provides an electronic device handling apparatus for handling an electronic device to be tested and bringing terminals of the electronic device to be tested electrically contact with a contact portion of a test head, comprising the insert (inventions 1 to 11) as above (invention 13).

Fourthly, the present invention provides an electronic device handling apparatus for handling an electronic device to be tested and bringing terminals of the electronic device to be tested electrically contact with a contact portion of a test head, comprising the tray (invention 12) as above (invention 14).

BRIEF DESCRIPTION OF DRAWINGS

FIGS. 15(a) to (c) are sectional views for explaining an operation of the conventional insert.

BEST MODE FOR CARRYING OUT THE INVENTION

Below, preferred embodiments of the present invention will be explained based on the drawings.

Figure 1:
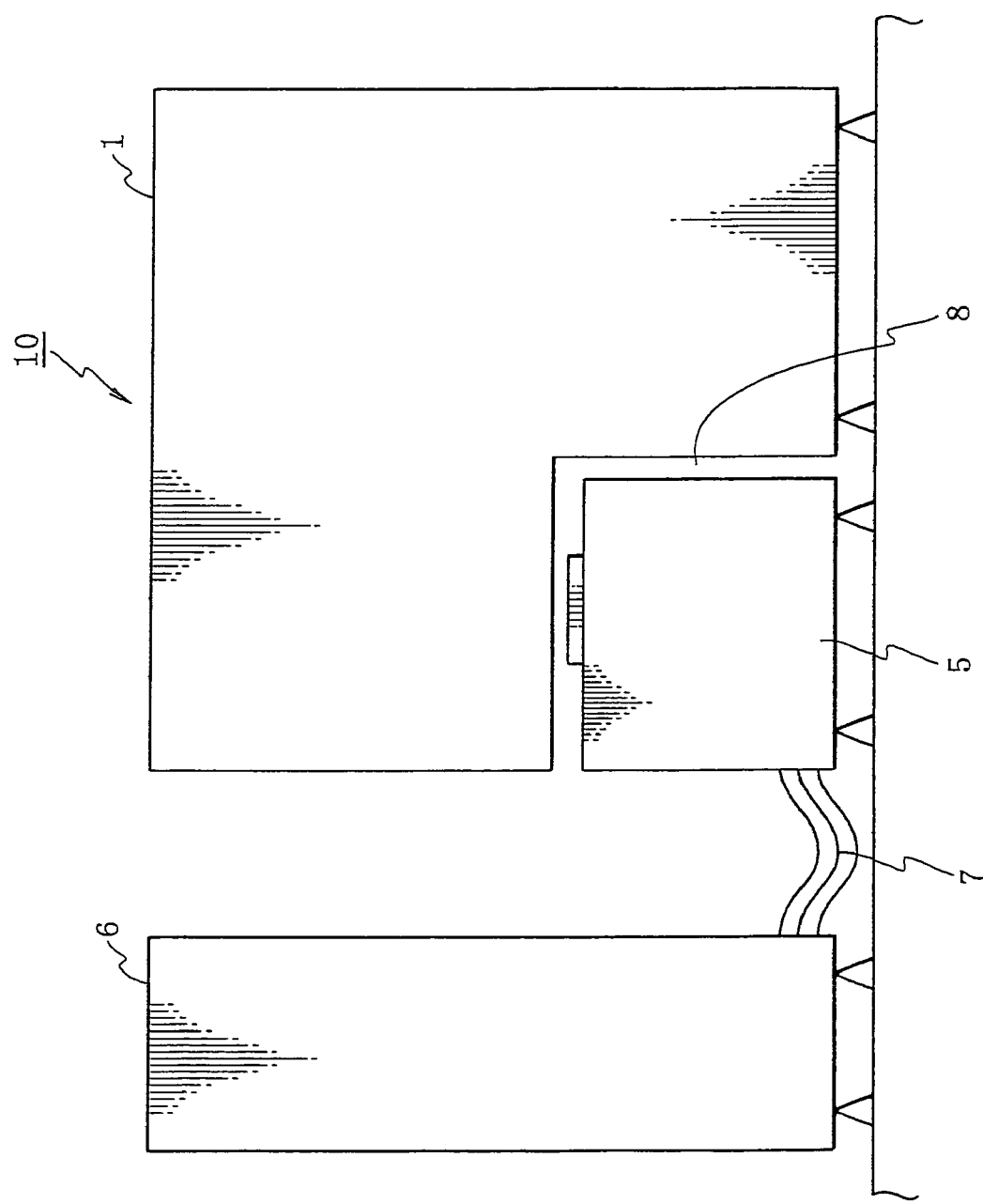
FIG. 1 is an overall view from the side of an IC device testing apparatus including a handler according to an embodiment of the present invention.

First, the overall configuration of an IC device testing apparatus provided with an electronic device handling apparatus (hereinafter, referred to as "a handler") according to the present embodiment will be explained. As shown in FIG. 1, the IC device testing apparatus 10 comprises a handler 1, a test head 5 and a main testing apparatus 6. The handler 1 performs operations of successively transferring IC devices to be tested (an example of electronic devices) to sockets provided to the test head 5, sorting tested IC devices in accordance with the test results, and storing on predetermined trays. Note that CSP type IC devices are tested in the present embodiment.

The sockets provided to the test head 5 are electrically connected to the main testing apparatus 6 via cables 7, the IC devices detachably attached to the sockets are connected to the main testing apparatus 6 via the cables 7, and the IC devices are tested by testing electric signals from the main testing apparatus 6.

The handler 1 has a built-in control apparatus at its lower portion for mainly controlling the handler 1, and a part thereof is provided with a space portion 8. In this space portion 8, the test head 5 is arranged in a changeable way. The IC devices can be attached to the sockets on the test head 5 through holes formed on the handler 1.

Figure 2:
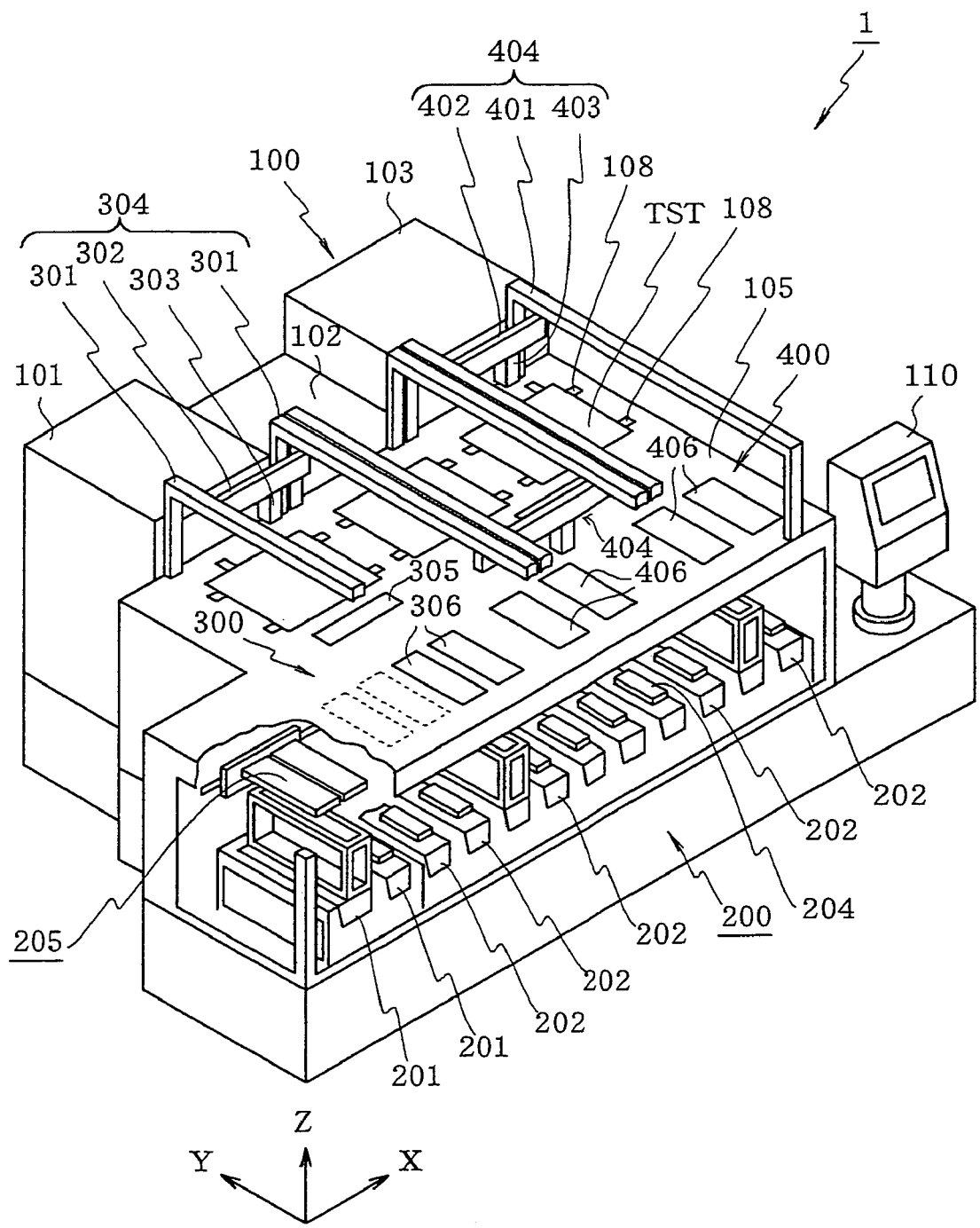
FIG. 2 is a perspective view of the handler shown in FIG. 1.
Figure 3:
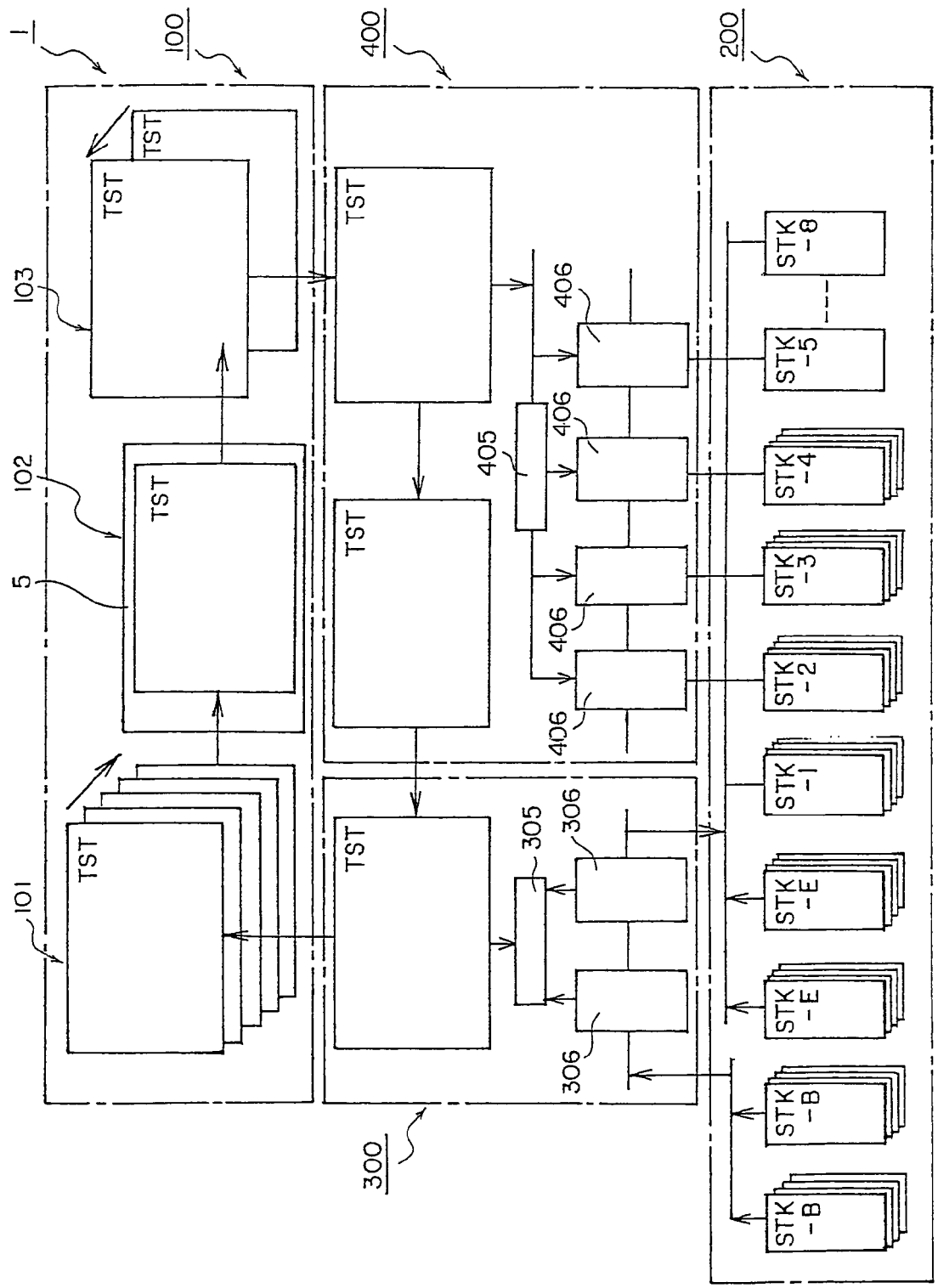
FIG. 3 is a flowchart of a tray showing a method of handling an IC device to be tested.
Figure 6:
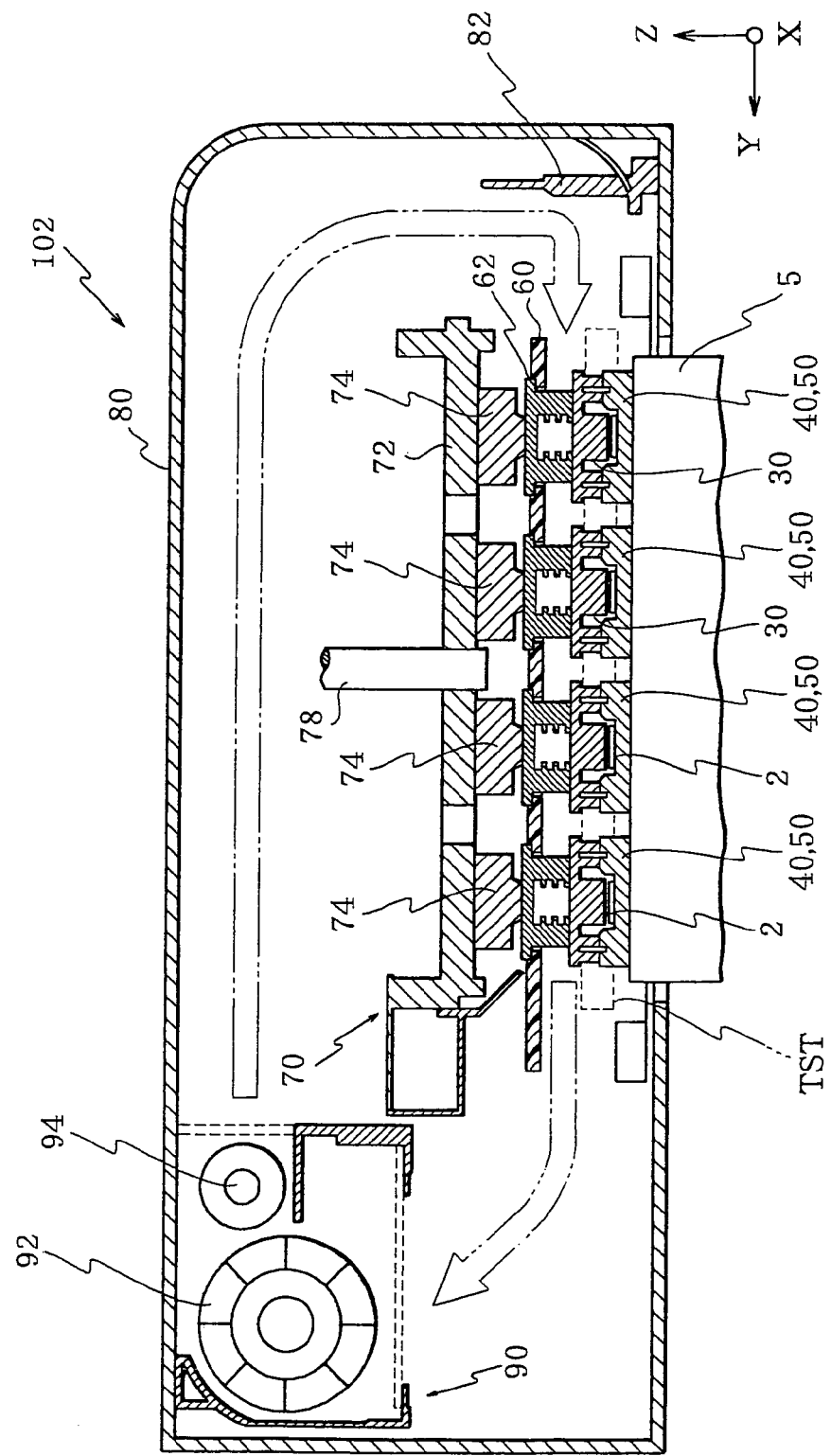
FIG. 6 is a sectional view of a principal part in a test chamber of the same handler.

The handler 1 is an apparatus for conducting tests on the IC devices as electronic devices to be tested at a higher temperature state (high temperature) or a lower temperature state (low temperature) than the normal temperature, and the handler 1 comprises a chamber 100 composed of a constant temperature chamber 101, a test chamber 102 and an unsoak chamber 103 as shown in FIG. 2 and FIG. 3. The upper portion of the test head 5 shown in FIG. 1 is inserted inside the test chamber 102 as shown in FIG. 6 to conduct a test on the IC devices 2.

Note that FIG. 3 is a view for understanding a method of handling IC devices to be tested by the handler of the present embodiment, wherein partially shows by a plan view members actually arranged aligned in the vertical direction. Therefore, the mechanical (three-dimensional) structure can be understood with reference mainly to FIG. 2.

As shown in FIG. 2 and FIG. 3, the handler 1 of the present embodiment comprises an IC magazine 200 for storing pre-test IC devices and classifying and storing post-test IC devices, a loader section 300 for transferring IC devices to be tested sent from the IC magazine 200 to the chamber section 100, a chamber section 100 including the test head, and an unloader section 400 for taking out and classifying IC devices tested in the chamber section 100. The IC devices are housed in a test tray TST (refer to FIG. 7) to be conveyed in the handler 1.

Figure 5:
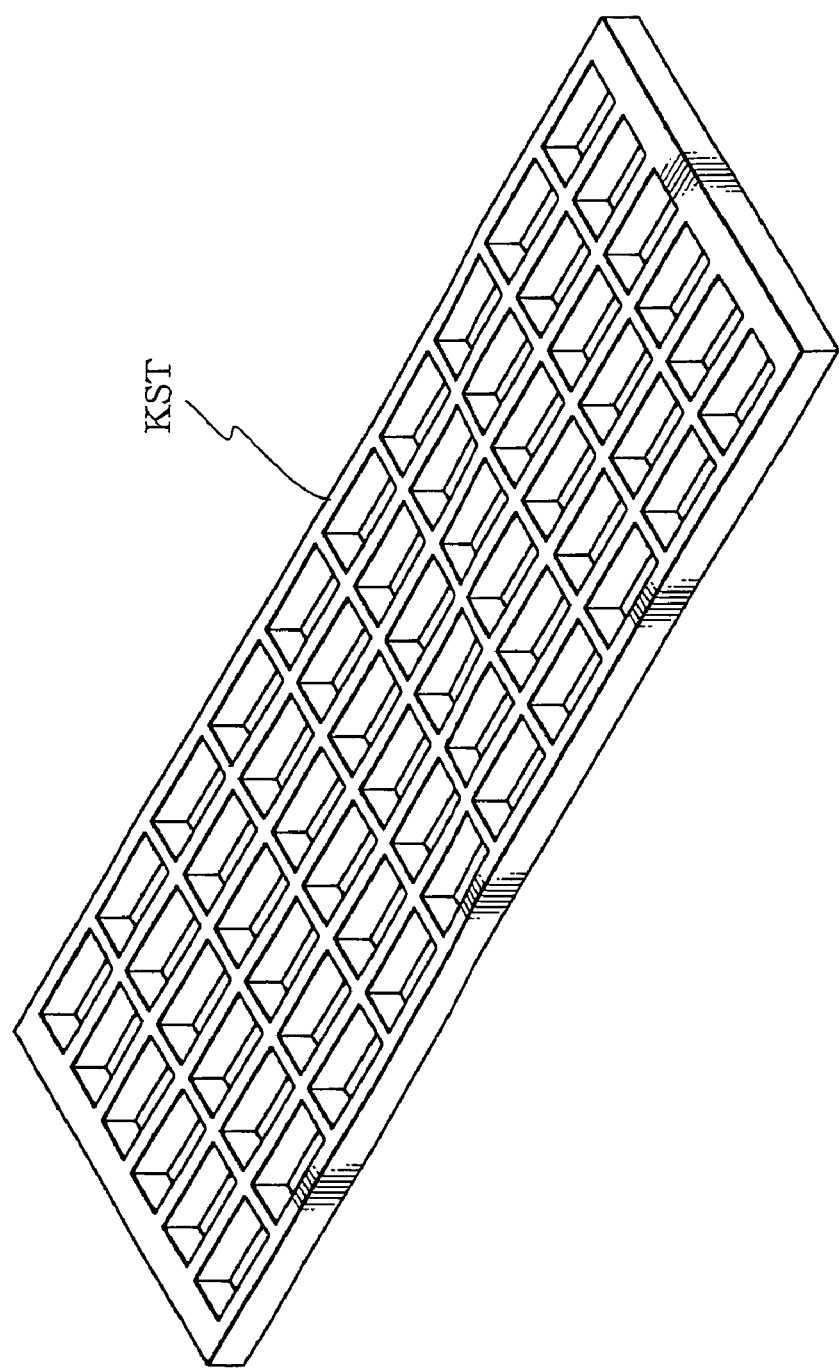
FIG. 5 is a perspective view showing a customer tray used in the same handler.

A large number of the IC devices are housed in a customer tray KST shown in FIG. 5 before being set in the handler 1 and supplied in that state to the IC magazine 200 of the handler 1 shown in FIG. 2 and FIG. 3, and the IC devices are reloaded from the customer tray KST to the test tray TST to be conveyed in the handler 1. Inside the handler 1, as shown in FIG. 3, the IC devices 2 are moved in a state of being loaded on the test tray TST, given a thermal stress of a high temperature or a low temperature for testing (inspecting) whether or not they operate appropriately, and sorted in accordance with the test results. Below, inside of the handler 1 will be explained individually in detail.

First, a part relating to the IC magazine 200 will be explained.

As shown in FIG. 2, the IC magazine 200 is provided with a pre-test IC stocker 201 for storing IC devices before tested and a post-test IC stocker 202 for storing IC devices classified in accordance with the test results.

Figure 4:
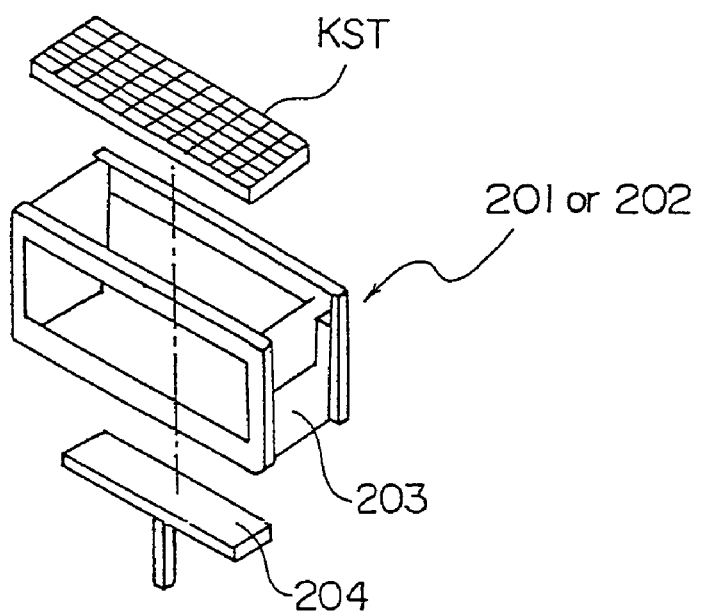
FIG. 4 is a perspective view showing the configuration of an IC stocker of the same handler.

These pre-test IC stocker 201 and post-test IC stocker 202 comprise, as shown in FIG. 4, a frame-shaped tray support frame 203 and an elevator 204 capable of entering from under the tray support frame 203 and moving toward the top. The tray support frame 203 supports in it a plurality of stacked customer trays KST, and only the stacked customer trays KST are moved up and down by the elevator 204. Note that the customer tray KST in the present embodiment has an IC device holder of 10 lines by 6 rows as shown in FIG. 5.

The pre-test IC stocker 201 shown in FIG. 2 holds stacked customer trays KST on which the IC devices to be tested are housed, while the post-test IC stocker 202 holds stacked customer trays KST on which IC devices finished being tested and classified are housed.

Note that since the pre-test IC stocker 201 and the post-test IC stocker 202 are structured substantially the same, a pre-test IC stocker 201 can be used as a post-test IC stocker 202, and the opposite case is also possible. Accordingly, the number of the pre-test stocker 201 and the number of the post-test IC stocker 202 can be easily changed in accordance with need.

As shown in FIG. 2 and FIG. 3, in the present embodiment, two stockers SKT-B are provided as the pre-test IC stocker 201. Two empty stockers STK-E as the post-test IC stocker 202 to be sent to the unloader section 400 are provided next to the stockers STK-B. Furthermore, next to that, eight stockers SKT-1, SKT-2, . . . , SKT-8 are provided as the post-test stocker 202 and configured to be able to hold IC devices sorted into a maximum of eight classes according to the test results. That is, in addition to classifying IC devices as good and defective, it is possible to sort the good ones into ones with high operating speeds, ones with medium speeds, and ones with low speeds and the defective ones into ones requiring retesting, etc.

Secondary, a part relating to the loader section 300 will be explained.

As shown in FIG. 2, an apparatus substrate 105 in the loader section 300 is formed three pairs of openings 306 arranged to allow the customer tray KST to face the upper surface of the apparatus substrate 105. Below the respective openings 306 are provided tray set elevators (not shown) for elevating and lowering the customer trays KST. Also, as shown in FIG. 2, between the IC magazine 200 and the apparatus substrate 105 is provided a tray transfer arm 205 capable of moving back and forth in the X-axis direction.

The elevator 204 of the pre-test IC stocker 201 shown in FIG. 4 elevates a customer tray KST held in the tray support frame 203. The tray transfer arm 205 receives the customer tray KST from the elevated elevator 204, moves in the X-axis direction, and gives the customer tray KST to a predetermined tray set elevator. The tray set elevator elevates the received customer tray KST to make it approach to be exposed from the opening 306 of the loader section 300.

Then, in the loader section 300, IC devices to be tested loaded on the customer trays KST are once transferred to the precisers 305 by X-Y conveyors 304, where mutual positions of the IC devices to be tested are corrected. Furthermore, the IC devices transferred to the precisers 305 are again reloaded on the test trays TST stopped on the loader section 300 by using the X-Y conveyors 304.

The X-Y conveyor 304 for reloading the IC device from the customer tray KST to the test tray TST comprises, as shown in FIG. 2, two rails 301 laid over an apparatus substrate 105, a movable arm 302 capable of moving back and forth (this direction designated as the Y-direction) between the test tray TST and the customer tray KST by the two rails 301, and a movable head 303 supported by the movable arm 302 and capable of moving in the X-direction along the movable arm 302.

The movable head 303 of the X-Y conveyor 304 has suction pads attached facing downward. The suction pads move while drawing air to pick up the IC devices to be tested from the customer tray KST and reload the IC devices to be tested on the test tray TST. For example, about eight suction pads are provided for the movable head 303, so it is possible to reload eight IC devices to be tested at one time on the test tray TST.

Thirdly, a part relating to the chamber 100 will be explained.

The above explained test tray TST is loaded with IC devices to be tested at the loader section 300, then sent to the chamber 100, where the respective IC devices are tested in the state of being loaded on the test tray TST.

As shown in FIG. 2 and FIG. 3, the chamber 100 comprises a constant temperature chamber 101 for giving a thermal stress of a targeted high temperature or a low temperature to the IC devices to be tested loaded on the test tray TST, a test chamber 102 wherein the IC devices in a state of being given a thermal stress in the constant temperature chamber 101 are mounted on sockets on the test head 5, and an unsoak chamber 103 for removing the given thermal stress from the IC devices tested in the test chamber 102.

In the unsoak chamber 103, the IC devices are brought back to the room temperature by ventilation when a high temperature was applied in the constant temperature chamber 101, and brought back to a temperature of a degree not causing condensation by heating by a hot air or a heater, etc. when a low temperature was applied in the constant temperature chamber 101. Then, the IC devices brought to a normal temperature are taken out to the unloader section 400.

As shown in FIG. 2, the constant temperature chamber 101 and the unsoak chamber 103 of the chamber 100 are arranged so as to project upward from the test chamber 102. Also, the constant temperature chamber 101 is provided with a vertical conveyor as shown conceptually in FIG. 3, and a plurality of test trays TST are supported by the vertical conveyor to wait until the test chamber 102 becomes available. The IC devices to be tested are applied a thermal stress of a high temperature or a low temperature mainly while waiting here.

Figure 7:
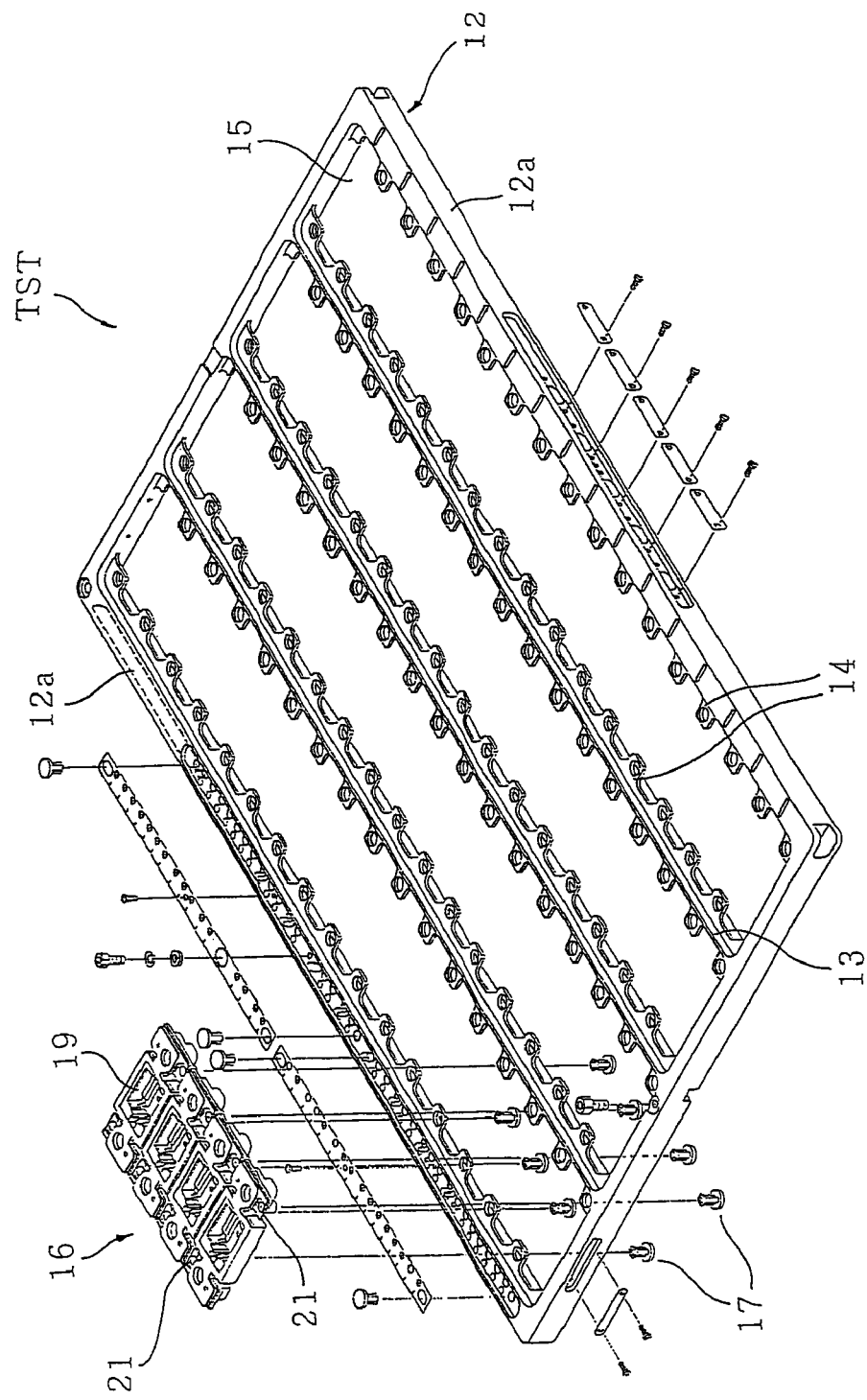
FIG. 7 is a partially disassembled perspective view showing a test tray used in the same handler.

As shown in FIG. 6, a test head 5 is arranged at a lower center portion in the test chamber 102 and the test tray TST is transferred to be on the test head 5, where all IC devices 2 held by the test tray TST shown in FIG. 7 are successively brought to electrically contact with the test head 5, and all IC devices 2 on the test tray TST are tested. On the other hand, the test tray TST finished the test is removed a thermal stress in the unsoak chamber 103, so that the temperature of the IC devices 2 is brought to the room temperature, then, taken out to the unloader section 400 shown in FIG. 2 and FIG. 3.

Also, as shown in FIG. 2, at an upper portion of the constant temperature chamber 101 and the unsoak chamber 103 is formed an inlet opening for taking in the test tray TST from the apparatus substrate 105 and an outlet opening for taking out the test tray TST to the apparatus substrate 105, respectively. On the apparatus substrate 105 is mounted test tray conveyors 108 for taking in and out the test tray TST to and from the openings. The conveyor 108 is composed of, for example, a rotating rollers, etc. The test tray TST taken out from the unsoak chamber 103 is conveyed to the unloader section 400 by the test tray conveyor 108 provided on the apparatus substrate 105.

FIG. 7 is a disassembled perspective view showing the configuration of the test tray TST used in the present embodiment. The test tray TST has a rectangular frame 12, and the frame 12 is provided with a plurality of bars 13 in parallel at regular intervals. On both sides of the bars 13 and inside the sides 12a of the frame 12 in parallel with the bars 13 are formed a plurality of mounting tabs 14 protruding in the longitudinal direction at regular intervals. Each of insert holders 15 is composed of two mounting tabs 14 facing to each other among the plurality of mounting tabs 14 provided between the bars 13 and between the bars and the sides 12a.

The each of the insert holders 15 is to hold one insert 16, and the insert 16 is attached to the two mounting tabs 14 in a floating state by using a fastener 17. In the present embodiment, the inserts 16 are provided to one test tray TST by the number of 4×16. Namely, the test tray TST in the present embodiment has 4 lines×16 rows of IC device holders. By being housed in the inserts 16, the IC devices 2 to be tested are loaded on the test tray TST.

The insert 16 comprises an insert body 161 and a drive plate 162 for covering the insert body 161 as shown in FIG. 8 to FIG. 11. At the center of the insert body 161 is formed an IC housing part 19 having an approximate rectangular shape on the plane view. Also, at the center at both ends of the insert body 161 are formed guide holes 20 for being inserted by a guide pin 32 of a pusher 30, and at the corner portions of the both ends of the insert body 161 are formed mounting holes 21 for the mounting tab 14 of the test tray TST and spring holding holes 22 for holding the drive plate coil spring 163 for biasing the drive plate 162 upward.

The IC housing part 19 is configured by being surrounded by four sidewall portions 191, 191', 192 and 192' formed on the insert body 161. The lower side of the IC housing part 19 in the insert body 161 is open, so that external terminals 2B of the IC device 2 housed in the IC housing part 19 are exposed, and a flange portion 193 for supporting the IC device 2 is provided around the opening portion.

In the insert body 161, at mutually facing two sidewall portions (two sidewall portions near the guide hole 20) 191 and 191' around the IC housing part 19 are formed concave portions 161b and 161c. Also, in the insert body 161, at one sidewall portion 192 between the two sidewalls 191 and 191' of the IC housing part 19 is formed a concave portion 161d, furthermore, at both sides of the concave portion 161d are formed slits 161e and 161e.

Among the sidewall portions surrounding the IC housing part 19, a lower end portion of the sidewall portion 191 and a lower end portion of the sidewall portion 192' facing to the sidewall portion 192 serve as contact portions 194 and 195 for side surfaces of an IC device 2 housed in the IC housing part 19 to contact.

The concave portion 161b formed on the insert body 161 is to hold a latch 164 and a drive member 165, and the concave portion 161c is to hold a pressing member 166 and a drive member 165'. Also, the concave portion 161d formed on the insert body 161 is to hold a pressing member 166' and respective slits 161e and 161e are to hold drive members 167 and 167 and a shaft 166f connecting the two drive members 167.

As shown in FIG. 9(b), on both sides at the lower portion of the concave portion 161b on the insert body 161 are formed two through holes 161f connected via the concave portion 161b, and both end portions of a later explained axis pin 164d fit in the through holes 161f. Also, on both sides of the concave portion 161c on the insert body 161 are formed grooves (not shown) for holding both end portions of later explained two pines 166d and 166d, and on both sides of the concave portion 161d are formed grooves 161g and 161g for holding both end portions of later explained two pins 166d and 166d.

The latch 164 in the present embodiment has an approximate T shape on the side view. On the lower end portion of the latch 164 is formed a through hole 164a, and the through hole 164a is penetrated by an axis pin 164d fitting in a through hole provided on both sides of the lower portion of the concave portion 161b. The latch 164 can swing about the axis pin 164d. The end portion on the IC housing part 19 side of the latch 164 is a suppressing portion 164c capable of suppressing the upper surface of the IC device 2 housed in the IC housing part 19, and at the end portion on the opposite side of the IC housing part 19 of the latch 164 is formed a long hole 164b for a pin 164e being allowed to slide to penetrate.

The pressing members 166 and 166' in the present embodiment have an approximate triangle shape when seen from the side. On the lower side portions of the pressing members 166 and 166' are formed a long hole 166a in the horizontal direction for two pins 166d and 166d being allowed to slide to penetrate. On the hypotenuse portion of the pressing member 166 on the IC housing part 19 side is formed a long hole 166b along the hypotenuse, that is, in a way of gradually approaching to the IC housing part 19 as getting downward, for the pin 166e or a shaft 166f being allowed to slide to penetrate. The end portions of the pressing members 166 and 166' on the IC housing part 19 side contact a side surface of the IC device 2 housed in the IC housing part 19 and serve as pressing portions 166c for pressing the IC device 2 against a contact portion 194 of the sidewall portion 191 or a contact portion 195 of the sidewall portion 192'.

Drive members 165 and 165' have two sidewall portions 165a to shape ⊃ like shape on the horizontally sectional view, and between the sidewall portions 165a is formed a space wherein the latch 164 is held being allowed to swing or the pressing member 166 being allowed to move in parallel. On the lower portion inside each of the sidewall portions 165a is formed a concave portion 165b for both end portions of the pin 164e or 166e to be held.

The drive member 167 in the present embodiment has an approximate plate shape. On the upper portion of the drive member 167 is formed a projection portion 167a protruding to the leaving direction from the other drive member 167. On the lower portion of the drive member 167 is formed a concave portion 167b for the end portion of the shaft 166f to be held.

A portion formed with the long hole 164b on the latch 164 is held in a space between two sidewall portions 165a of the drive member 165 in a state that the pin 164e penetrates the long hole 164b, and the both end portions of the pin 164e are held in the concave portions on the sidewall portions 165a, respectively. The latch 164 and the drive member 165 are held in the concave portion 161b of the insert body 161 in this state, and at this time, the coil spring 168 for biasing the drive member 165 upward is provided below the drive member 165. The axis pin 164d is inserted to penetrate the through hole 161f of the insert body 161 and the axis hole 164a of the latch 164.

The part formed with the long hole 166b on the pressing member 166 is held in the space between two sidewalls 165a of the drive member 165' in a state that the pin 166e penetrates the long hole 166b, and both end portions of the pin 166e are held in the concave portions of the sidewall portions 165a, respectively. Also, the long hole 166a of the pressing member 166 is penetrated by two pins 166d and 166d. The pressing member 166 and the drive member 165 are held in the concave portion 161c of the insert body 161 in this state, and two pins 166d and 166d are held in grooves (not shown) formed on both sides of the concave portion 161c. At this time, below the drive member 165', a coil spring 168 is provided for biasing the drive member 165' upward.

The long hole 166b of the pressing member 166' is penetrated by the shaft 166f, and both end portions of the shaft 166f are respectively held in the concave portions 167b of the drive member 167. Also, the long hole 166a of the pressing member 166' is penetrated by two pins 166d and 166d. The pressing member 166 and the drive members 167 and 167 are held in the concave 161d and slits 161e and 161e of the insert body 161 in this state. Two pins 166d and 166d are held in the grooves 161g and 161g formed on the both sides of the concave portion 161d. At this time, below the protrusion 167a of the respective drive members 167, a coil spring 168 is provided for biasing the drive member 167 upward.

Figure 8:
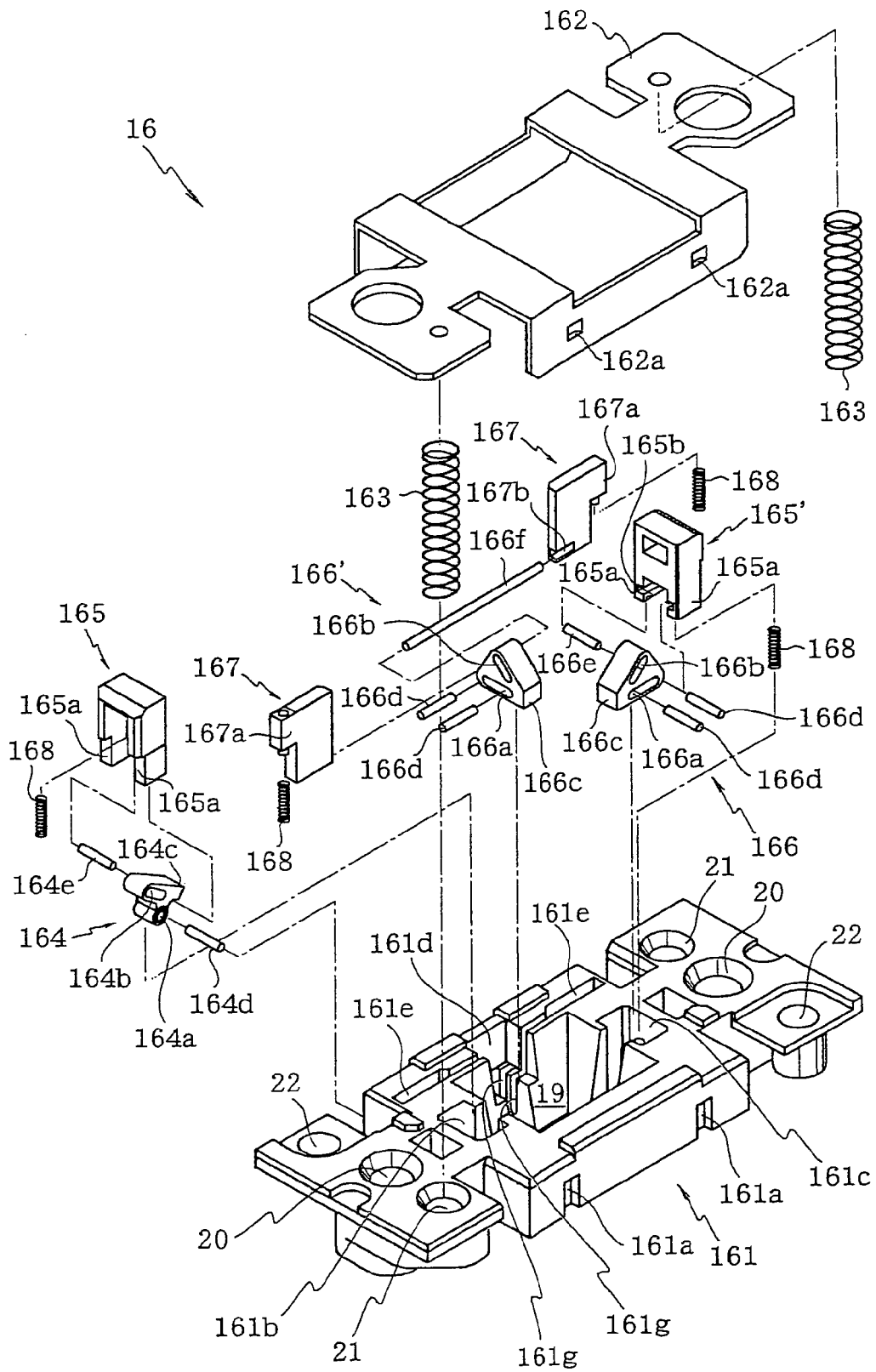
FIG. 8 is a disassembled perspective view of an insert used in the same handler.
Figure 9:
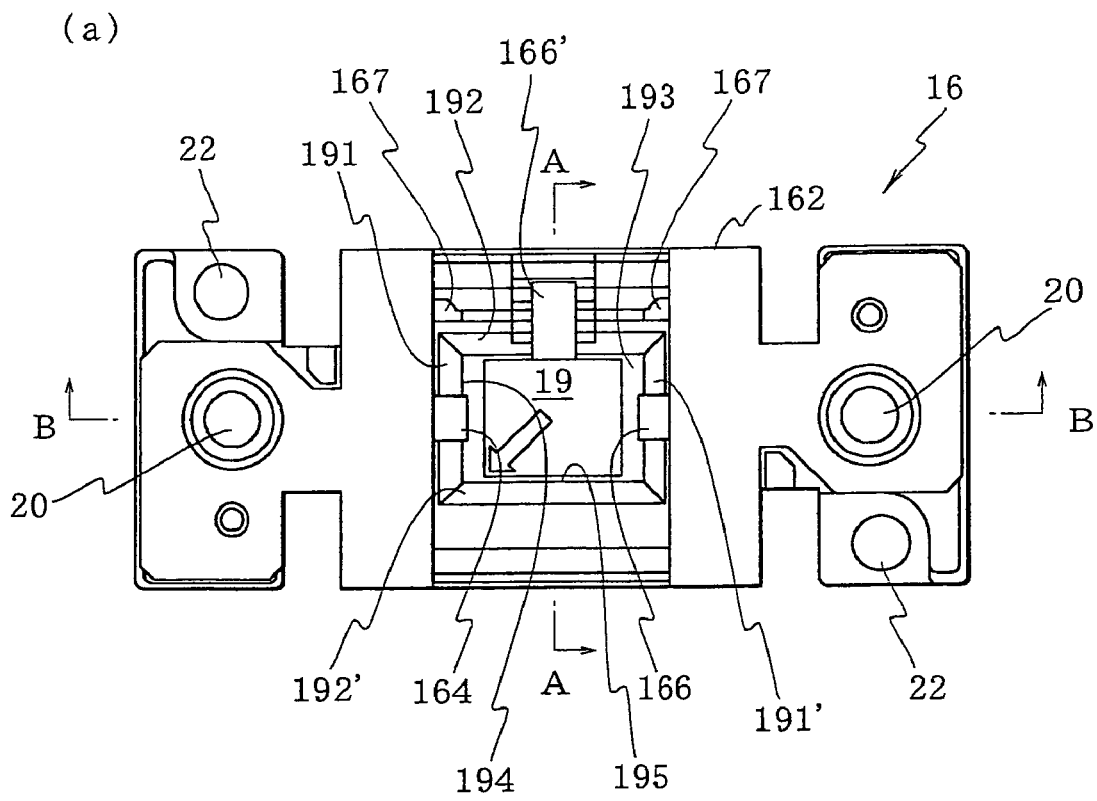
FIGS. 9(a) and (b) are a plan view and a front view of the insert used in the same handler.
Figure 9:
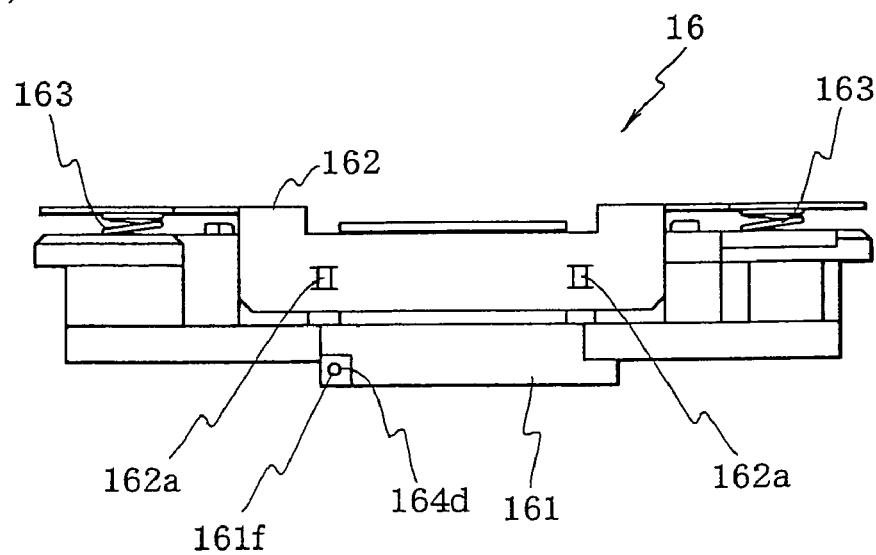

The drive plate 162 is attached to the inert body 161 in a state of being biased upward by the coil spring 163 held in the spring holding hole 22 of the insert body 161 (refer to FIG. 8). As a result that the convex portion 162a formed on the drive plate 162 engages to the concave portion 161a formed on the insert body 161, the upper limit position of the drive plate 162 is regulated. Consequently, the drive plate 162 elastically approaches or recedes from the insert body 161.

Figure 10:
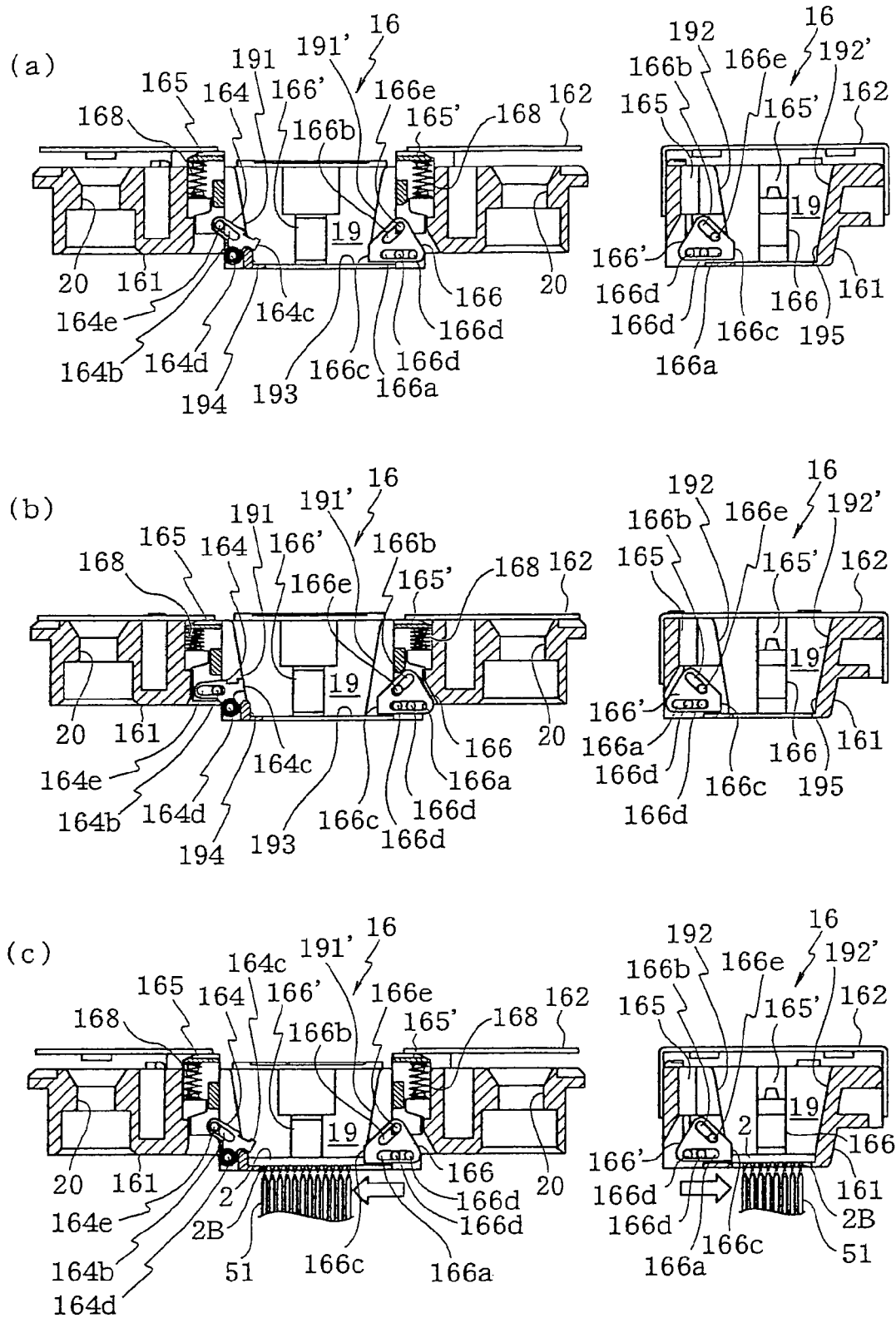
FIGS. 10(a) to (c) are sectional views (a sectional view along the line A-A and a sectional view along the line B-B in FIG. 9(a)) for explaining an operation of the insert used in the same handler.

As shown in FIG. 10, the drive members 165, 165' and drive members 167 and 167' are pressed by the drive plate 162, and are capable of elastically moving up and down by the coil spring 168.

When the drive member 165 moves up and down, the pin 164e attached to the drive member 165 slides in the long hole 164b of the latch 164, and being interlocked therewith, the latch 164 swings about the axis pin 164d. Namely, when the drive member 165 moves upward, the pin 164e moves up along the long hole 164b, and the latch 164 swings along with that to go out to the IC housing part 19 from the concave portion 161b (FIG. 10(a)). On the other hand, when the drive member 165 moves downward, the pin 164e moves down along the long hole 164b of the latch 164, and the latch 164 swings along with that to recede from the IC housing part 19 to the concave portion 161c (FIG. 10(b)). When the latch 164 goes out to the IC housing part 19, the suppressing portion 164c of the latch 164 can suppress the upper surface of the IC device 2 housed in the IC housing part 19 (FIG. 10(c)).

Also, when the drive member 165' moves up and down, the pin 166e attached to the drive member 165' slides along the long hole 166b of the pressing member 166, and being interlocked therewith, the pressing member 166 moves in parallel to the open lower side and flange portion 193 of the IC housing part in the horizontal direction while being supported by the pins 166d and 166d in the long hole 166a. Namely, when the drive member 165 moves upward, the pin 166e moves up along the long hole 166b of the pressing member 166, and the pressing member 166 moves in parallel to the open lower side and flange portion 193 of the IC housing part along with that to go out to the IC housing part 19 from the concave portion 161c (FIG. 10(a)). On the other hand, when the drive member 165 moves down, the pin 166e moves down along the long hole 166b of the pressing member 166, and the pressing member 166 moves in parallel to the open lower side and flange portion 193 of the IC housing part along with that to recede from the IC housing part 19 to the concave portion 161c (FIG. 10(b)). When the pressing member 166 goes out to the IC housing part 19, the pressing portion 166c of the pressing member 166 contacts the side surface of the IC device 2 to be housed in the IC housing part 19 and presses the IC device 2 against the contact portion 194 (FIG. 10(c)).

Furthermore, when the drive members 167 and 167 move up and down, the shaft 166f attached to the drive members 167 and 167 slides along the long hole 166b of the pressing member 166', and being interlocked therewith, the pressing member 166' moves in parallel in the horizontal direction while being supported by the pins 166d and 166d in the long hole 166a. Namely, when the drive members 167 and 167 move upward, the shaft 166f moves upward along the long hole 166b of the pressing member 166', and along with that, the pressing member 166' moves in parallel to go out to the IC housing part 19 from the concave portion 161d (FIG. 10(a)). On the other hand, when the drive members 167 and 167 move downward, the shaft 166f moves downward along the long hole 166b of the pressing member 166, and along with that, the pressing member 166' moves in parallel to recede from the IC housing part 19 to the concave portion 161d (FIG. 10(b)). When the pressing member 166' goes out to the IC housing part 19, the pressing portion 166c of the pressing member 166' contacts the side surface of the IC device 2 housed in the IC housing part 19 to press the IC device 2 against the contact portion 195 of the sidewall portion 192' (FIG. 10(c)).

On the test head 5, a socket 50 having probe pins 51 as shown in FIG. 11(a) is arranged. The probe pins 51 are provided by the number and pitches corresponding to those of the external terminals 2B of the IC device 2 and biased upward by a spring. The socket 50 is formed a socket reference hole 501.

A socket guide 40 as shown in FIG. 11(a) is fixed around the socket 50. On the lower side of the socket guide 40, an alignment pin 401 to fit in the socket reference hole 501 of the socket 50 and an alignment pin 411 to fit in the hole formed on the test head 5 (socket board) are formed. Also, on the upper side of the socket guide 40 is provided guide bushes 41 to be inserted two guide pins 32 formed on the pusher 30 for aligning with the two guide pins 32 and stopper portions 42 for two stopper pins 33 formed on the pusher 30 to contact.

As shown in FIG. 6 and FIG. 11(a), pushers 30 by the number corresponding to the number of the sockets 50 are provided on the upper side of the test head 5. At the center of the lower side of the pusher 30 is provided with a downwardly facing pushing member 31 for pressing the IC device 2 to be tested, and both end portions on the lower side of the pusher 30 are provided with guide pins 32 to be inserted to the guide hole 20 of the insert 16 and to the guide bush 41 of the socket guide 40. Also, between the pushing member 31 and the guide pins 32 are provided with stopper pins 33 capable of regulating the lower limit by contacting the stopper portion 42 of the socket guide 40 when the pusher 30 moves downward by a Z-axis drive unit 70.

As shown in FIG. 6, each of the pushers 30 is fixed on the lower end of an adopter 62, and each adopter 62 is elastically held on the match plate 60. The match plate 60 is attached so as to position above the test head 5 and to allow a test tray TST to be inserted between the pusher 30 and the socket 50. The pusher 30 held by the match plate 60 is movable in the Z-axis direction with respect to the test head 5 or a drive plate (drive) 72 of the Z-axis drive unit 70. Note that the test tray TST is transported between the pusher 30 and the socket 50 from the perpendicular direction (X-axis) to the paper surface in FIG. 6 to. A conveyor roller, etc. is used as a conveying means of the test tray TST inside the chamber 100. When conveying the test tray TST, the drive plate of the Z-axis drive unit 70 is elevated along the Z-axis direction and a sufficient space for the test tray TST to be inserted is formed between the pusher 30 and the socket 50.

As shown in FIG. 6, a pressing portion 74 is fixed on the lower surface of the drive plate 72, so that it can press against the upper surface of the adopter 62 held by the match plate 60. A drive shaft 78 is fixed on the drive plate 72, and the drive shaft 78 is connected to a drive source (not shown), such as a motor, so that the drive shaft 78 can move up and down along the Z-axis direction to press the adopter 62.

Note that the match plate 60 has the exchangeable configuration with the adopter 62 and the pusher 30 in accordance with a shape of the IC device 2 to be tested and the number of the sockets of the test head 5 (the number of IC devices 2 to be tested at a time), etc. As a result that the match plate 60 can be freely exchanged, the Z-axis drive unit 70 can be generally used.

In the present embodiment, in the chamber 100 configured as above, as shown in FIG. 6, inside the sealed casing 80 composing the test chamber 102 is fitted with a temperature adjusting ventilator 90. The temperature adjusting ventilator 90 comprises a fan 92 and a heat exchanger 94 and brings inside the casing 80 to be under a predetermined temperature condition (a high temperature or a low temperature) by drawing in an air inside the casing by the fan 92, letting it through the heat exchanger 94 and blowing to inside the casing 80 for circulation.

The heat exchanger 94 of the temperature adjusting ventilator 90 is composed of a radiation heat exchanger, wherein a heating medium circulates, or an electric heater, etc. when bringing inside the casing to be a high temperature, so that it is possible to supply a sufficient heat quantity to maintain inside the casing to be, for example, the room temperature to a high temperature of 160° C. Also, when bringing inside the casing to be a low temperature, the heat exchanger 94 is composed of a heat-absorbing heat exchanger, wherein a cooling medium, such as liquid nitrogen, circulates, etc., so that it is possible to absorb a sufficient heat quantity to maintain inside the casing to be a low temperature of, for example, −60° C. to the room temperature or so. The temperature inside the casing 80 is detected, for example, by a temperature sensor 82 and an air flow volume of the fan 92 and a heat quantity of the heat exchanger 94, etc. are controlled to maintain inside the casing 80 to be a predetermined temperature.

A hot air or cold air generated through the heat exchanger 94 of the temperature adjusting ventilator 90 flows at the upper portion of the casing 80 along the Y-axis direction, falls along the casing sidewall on the opposite side of the ventilator 90, flows through between the match plate 60 and the test head 5, and returns back to the ventilator 90 for circulation.

Fourthly, a part relating to the unloader section 400 will be explained.

The unloader section 400 shown in FIG. 2 and FIG. 3 is provided with X-Y conveyors 404 and 404 having the same configuration with that of the X-Y conveyor 304 provided to the loader section 300. Post-test IC devices are reloaded from the test tray TST conveyed out to the unloader section 400 to a customer tray KST by the X-Y conveyors 404 and 404.

As shown in FIG. 2, an apparatus substrate 105 of the unloader section 400 is provided with two pairs of windows 406 and 406 arranged so that the customer trays KST conveyed to the unloader section 400 can be brought to face to the upper surface of the apparatus substrate 105. Below each of the windows 406 is provided a tray set elevator (not shown) for elevating and lowering the customer tray KST.

A customer tray KST becoming full after being reloaded with the post-test IC devices (a full tray) is placed on the tray set elevator and lowered. The tray transfer arm 205 shown in FIG. 2 receives the full tray from the lowered tray set elevator, moves in the X-axis direction and passes the full tray to the elevator 204 (refer to FIG. 4) of a predetermined post-test IC stocker 202. In this way, the full tray is stored in the post-test IC stocker 202.

Next, a method of housing IC devices 2 in inserts 16 and a method of conducting tests on the IC devices 2 in the above IC device testing apparatus 10 will be explained.

In the loader section 300 of the handler 1, IC devices 2 to be tested loaded on the customer tray KST are picked up by suction pads attached to a movable head 303 of the X-Y conveyor 304 and transferred above IC housing parts 19 of inserts 16 attached to the test tray TST. The insert 16 in this state (a condition with no load) is shown in FIG. 10(*a*).

Next, an alignment device (not shown) provided to surround the suction pads is lowered proceeding to the suction pads to push down the drive plate 162 covering the insert 16 and brings it to approach and contact the insert body 161.

The drive plate 162 presses the drive members 165 and 165' and the drive members 167 and 167, so that the drive members 165 and 165' and the drive members 167 and 167 move downward.

As shown in FIG. 10(*b*), when the drive member 165 moves downward, the latch 164 swings about the axis pin 164*d* to be receded from the IC housing part 19, when the drive member 165' moves downward, the pressing member 166 moves in parallel in the horizontal direction while supported by the pin 166*e* and pins 166*d* and 166*d* to be receded from the IC housing part 19, and when the drive members 167 and 167 move downward, the pressing member 166' moves in parallel in the horizontal direction while supported by the pins 166*d* and 166*d* to be receded from the IC housing part 19.

When the latch 164 and pressing members 166 and 166' recede from the IC housing part 19, the suction pads carrying the IC devices 2 are lowered to place the IC devices 2 in the IC housing parts 19 and stop sucking the IC devices 2. When the IC devices 2 are housed in the IC housing parts 19 of the inserts 16 in this way, the suction pads and the alignment device are elevated.

When the alignment device is elevated, the drive plate 162 biased by the drive plate coil spring 163 leaves the insert body 161, and along with that, the drive members 165 and 165' and the drive members 167 and 167 biased by the coil spring 168 move upward.

As shown in FIG. 10(*c*), when the drive member 165 moves upward, the latch 164 swings about the axis pin 164*d* to go out to the IC housing part 19. At this time, the suppressing portion 164*c* of the latch 164 covers the upper surface of the IC device 2, therefore, the IC device 2 is prevented from jumping out from the IC housing part 19 when transferring the test tray TST loaded with the IC device 2.

As shown in FIG. 10(*c*), when the drive member 165' moves upward, the pressing member 166 moves in parallel in the horizontal direction while supported by the pin 166*e* and the pins 166*d* and 166*d* to go out to the IC housing part 19. At this time, the pressing portion 166*c* of the pressing member 166 contacts the side surface of the IC device 2 housed in the IC housing part 19 and presses the IC device 2 against the contact portion 194 of the sidewall portion 191.

As shown in FIG. 10(*c*), when the drive members 167 and 167 move upward, the pressing member 166' moves in parallel in the horizontal direction while supported by the shaft 166*f* and pins 166*d* and 166*d* to go out to the IC housing part 19. At this time, the pressing portion 166*c* of the pressing member 166' contacts the side surface of the IC device 2 housed in the IC housing part 19 and presses the IC device 2 against the contact portion 195 of the sidewall portion 192'.

After the IC device 2 is heated to be a predetermined set temperature in the constant temperature chamber 101 in the state of being housed in the IC housing part 19 of the insert 16, it is conveyed to inside the test chamber 102.

As shown in FIG. 6, when the test tray TST loaded with IC devices 2 stops above the test head 5, the Z-axis drive unit 70 drives to make pressing portions 74 fixed on the drive plate 72 press and lower the pushers 30 via adopters 62. As a result, guide pins 32 of the pushers 30 are inserted to guide holes 20 of the insert bodies 161, and the pushers 30, the inserts 16 and the sockets 50 are aligned. Then, the pressing tabs 31 of the pushers 30 presses package bodies of the IC devices 2 against the sockets 50 side, so that external terminals 2B of the IC devices 2 are connected to the probe pins 51 of the socket 50.

In this state, a test electric signal is transmitted from the main testing device 6 to the IC devices 2 to be tested via the probe pins 51 of the sockets 50 so as to conduct a test.

Here, even in the case where an IC device 2 formed to have small outer dimensions by an error is housed in the IC housing part 19, the IC device 2 is pressed against the contact portion 194 of the sidewall portion 191 and the contact portion 195 of the sidewall portion 192' in the IC housing part 19 so as not to play therein, therefore, the external terminals 2B are brought to surely contact with the probe pins 51 as far as it is an IC device 2 within a normal error range (IC device 2 with no excessive errors in dimensions from the device side surface for contacting the contact portion 194 and the device sides surface for contacting the contact portion 195 to the external terminals 2B). Accordingly, it is possible to decrease arising of contact errors due to alignment deviation between the external terminals 2B of the IC device 2 and the probe pins 51, abnormal deformation of the external terminals 2B and bending and breaking of the probe pins 51, etc caused by the probe pins 51 sticking positions deviated from the center of the external terminals 2B. Particularly, in an IC device 2 having a large tolerance in dimensions from one side surface or adjacent two side surfaces to the external terminals 2B, by bringing opposing side surfaces of these side surfaces contact the contact portion 194 of the sidewall portion 191 or the contact portion 195 of the sidewall portion 192' in the IC housing part 19, it is possible to efficiently decrease arising of contact errors, abnormal deformation of the external terminals 2B, bending and breaking of the probe pins 51, etc.

Figure 11:
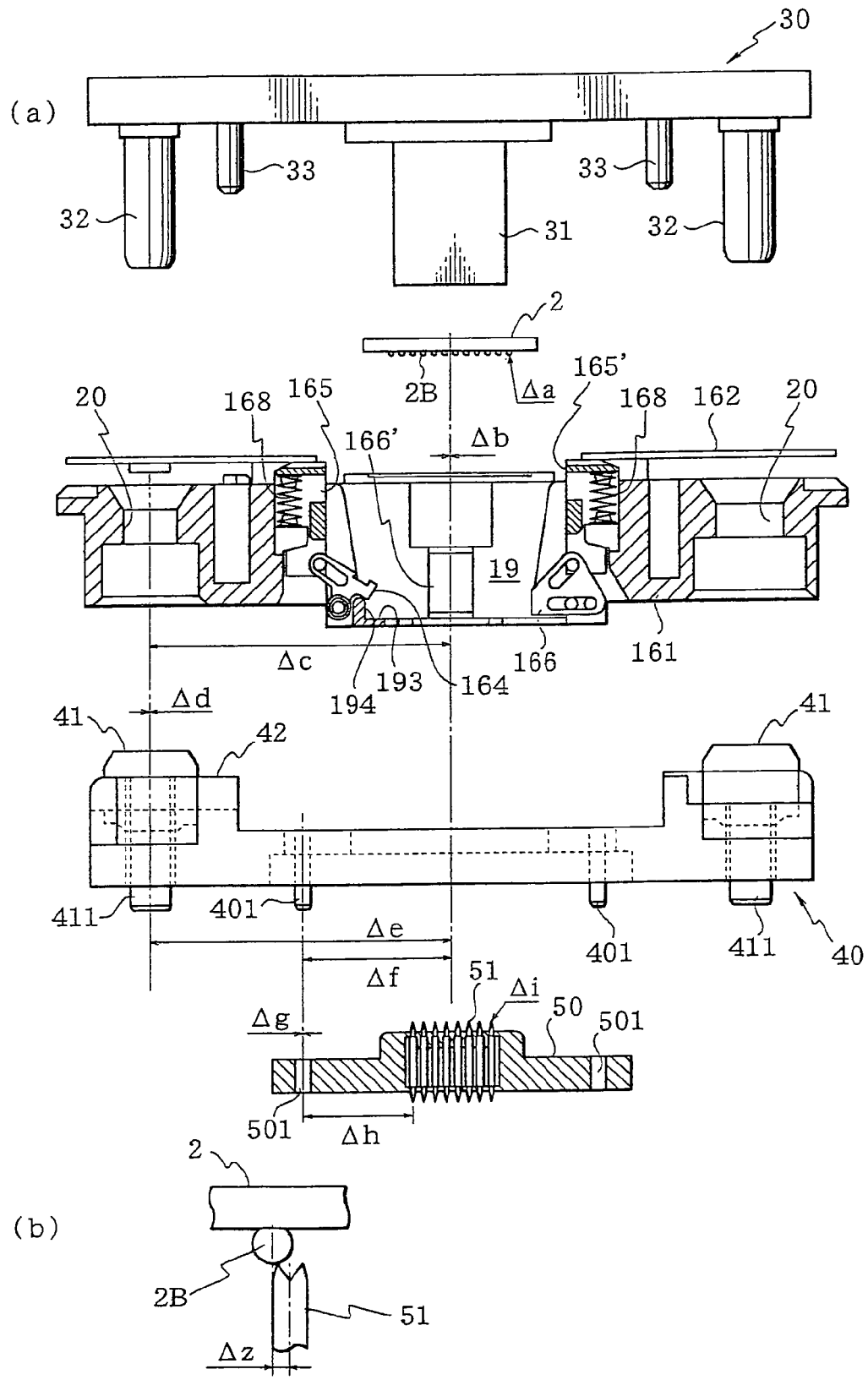
FIG. 11(a) is a front view and a sectional view of a pusher, an insert, socket guides and sockets used in the same handler, and (b) is an enlarged view of an external terminal of the IC device and a probe pin.

A detail explanation will be made with reference to FIG. 11. A positional error Δz between the external terminal 2B of the IC device 2 and the probe pin 51 in FIG. 11(b) is expressed by the formula below.

$$\Delta z = \sqrt{(\Delta a^2 + \Delta b^2 + \Delta c^2 + \Delta d^2 + \Delta e^2 + \Delta f^2 + \Delta g^2 + \Delta h^2 + \Delta i^2)}$$

Δa: an error amount from the device side surface to the external terminal 2B

Δb: an error amount of the IC device 2 in the IC housing part 19

Δc: an error amount from the center of the IC housing part 19 to the guide hole 20

Δd: an error amount between the insert 16 and the socket guide 40

Δe: an error amount from the center of the socket guide 40 to an alignment pin 411

Δf: an error amount from the center of the socket guide 40 to an alignment pin 401

Δg: an error amount between the socket guide 40 and the socket 50

Δh: an error amount from the socket reference hole 501 to a hole for the probe pin Δi: an inclination amount of the probe pin (Refer to FIG. 11(a) for the above.)

The Δb accounts for the largest ratio in the error elements, but according to the present embodiment, since the Δb can be made "0" by pressing the IC device 2 against the contact portions 194 and 195 of the IC housing part 19, the value of the positional error Δz between the external terminal 2B of the IC device 2 and the probe pin 51 can be reduced at the end.

The embodiments explained above are described to facilitate understanding of the present invention and is not to limit the present invention. Accordingly, respective elements disclosed in the above embodiments include all design modifications and equivalents belonging to the technical scope of the present invention.

For example, the pressing member 166' and the drive members 167 and 167 or the pressing member 166 and the drive member 165' provided to the above insert 16 may be omitted.

Figure 12:
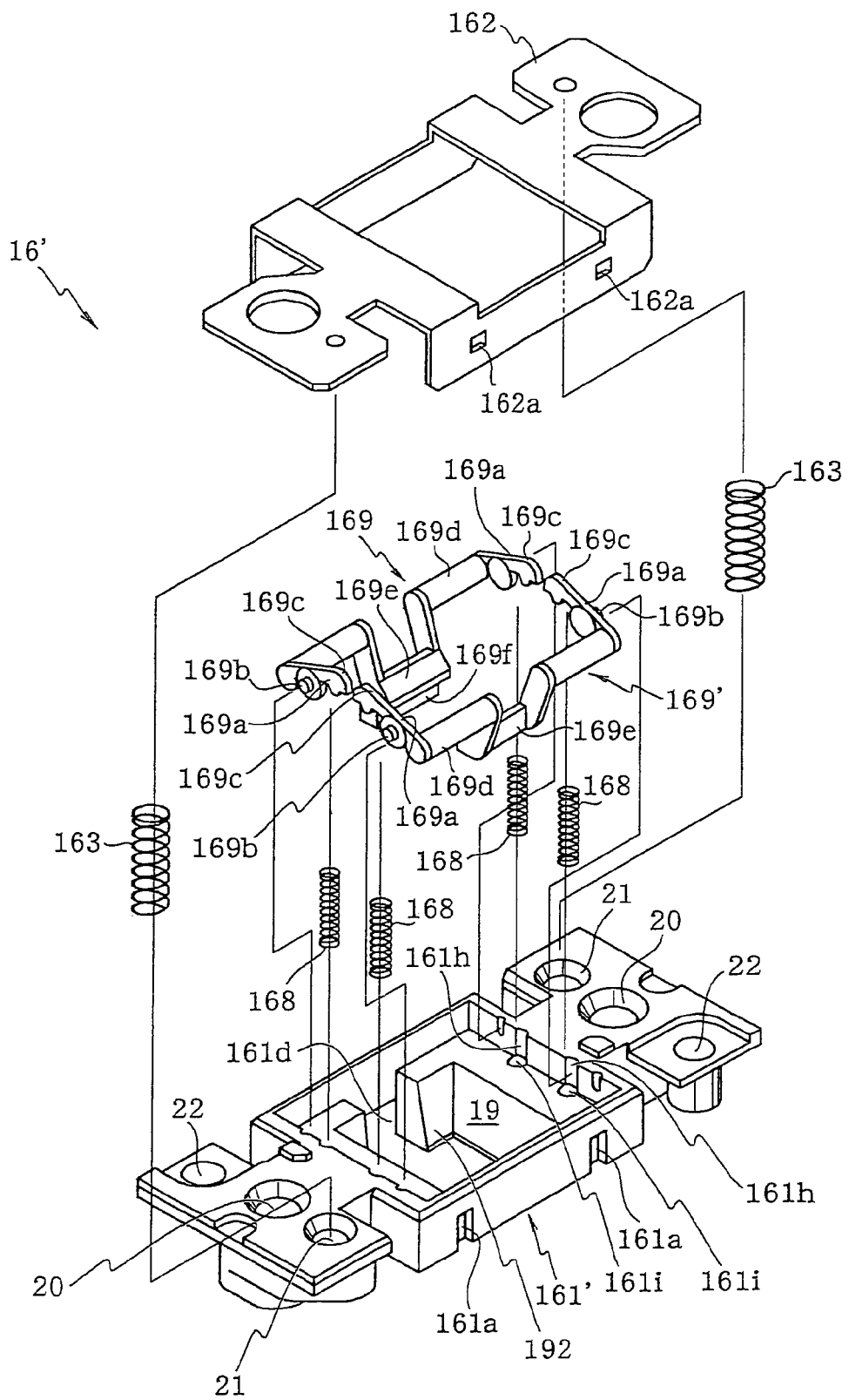
FIG. 12 is a disassembled perspective view of an insert according to another embodiment of the present invention.
Figure 13:
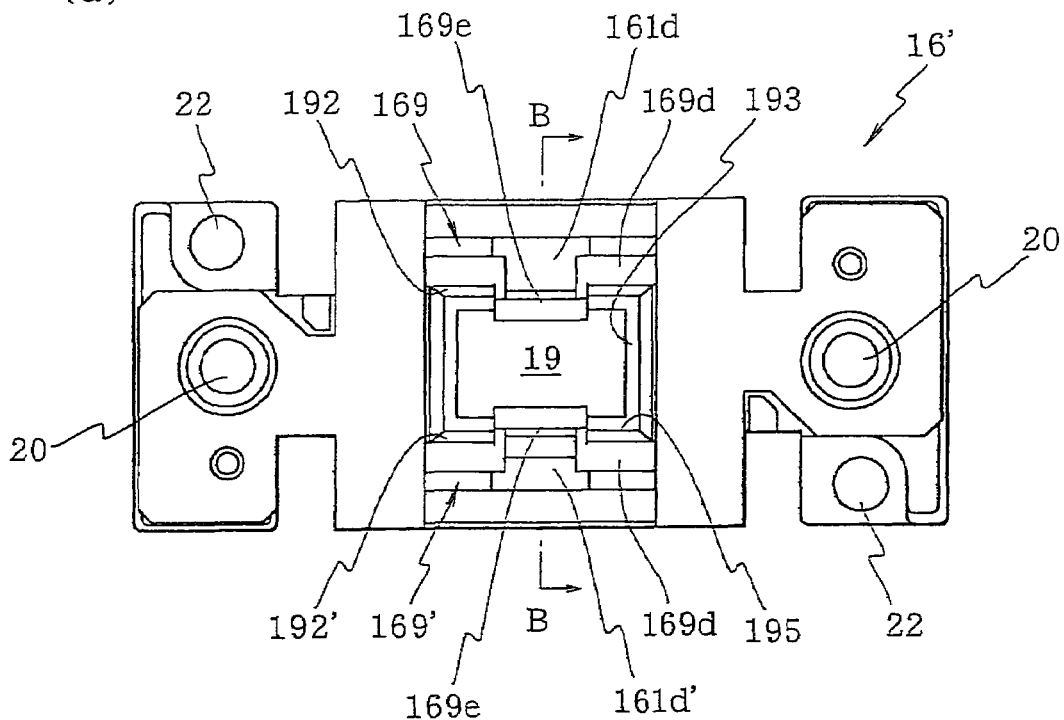
FIGS. 13(a) and (b) are a plan view and a front view of the same insert.
Figure 13:
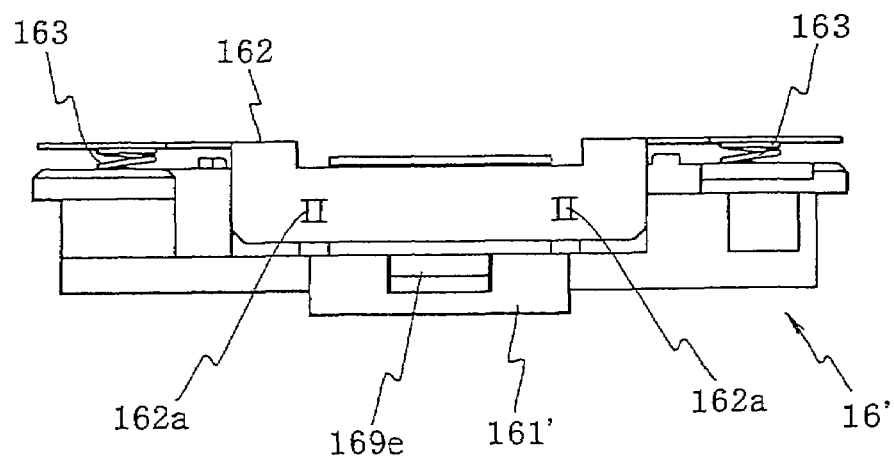
Figure 14:
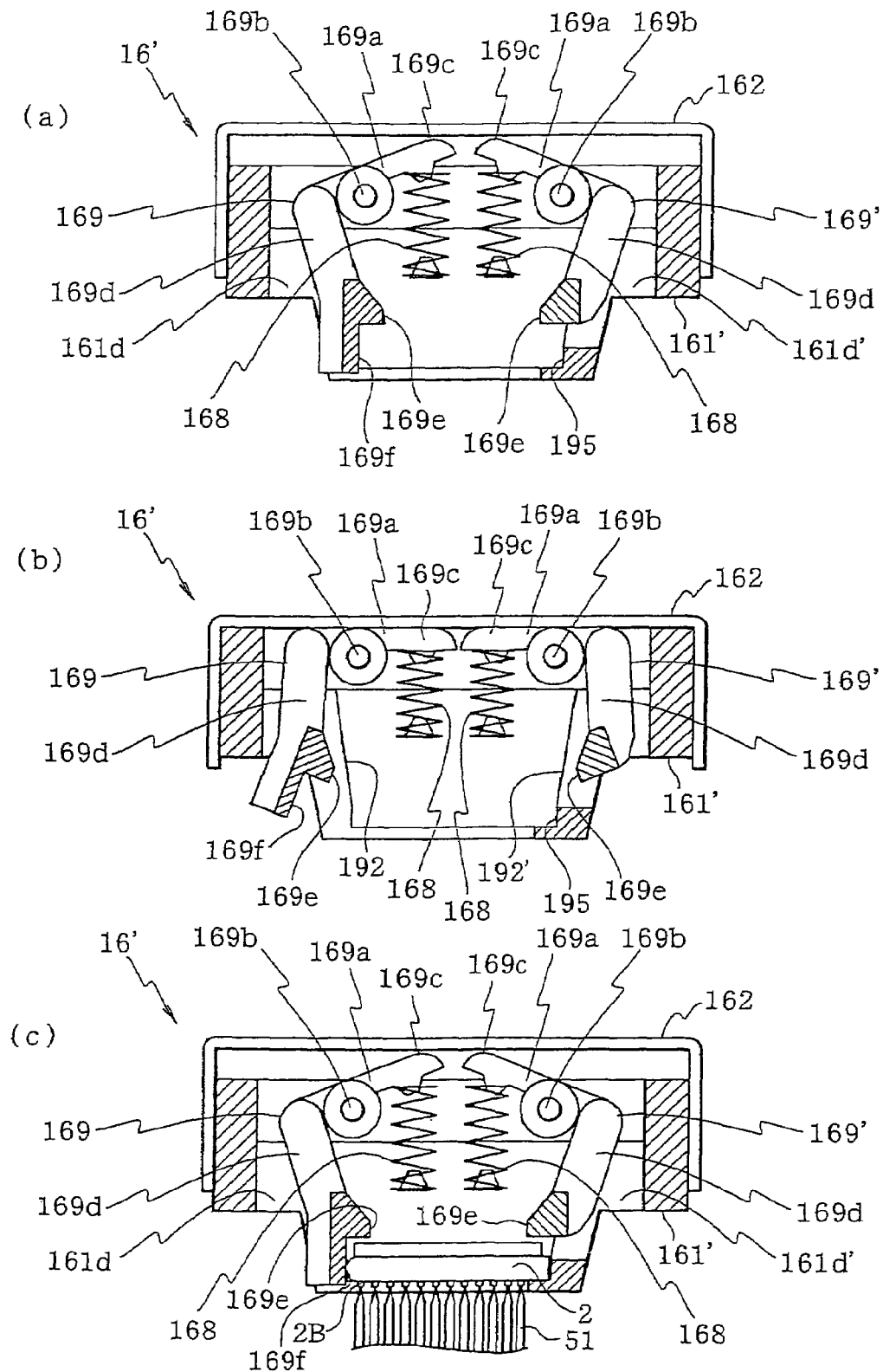
FIGS. 14(a) to (c) are sectional views (a sectional views along the line B-B in FIG. 13(a)) for explaining an operation of the same insert.

Also, the above insert 16 may be replaced by the insert 16' shown in FIG. 12 to FIG. 14.

The insert 16' comprises an insert body 161' and a drive plate 162 for covering the insert body 161' as shown in FIG. 12 to FIG. 14. In the same way as the insert body 161 of the above insert 16, on the insert body 161' are formed an IC housing part 19, guide holes 20, attachment holes 21 and spring holding holes 22.

Also, between the IC housing part 19 and the respective guide holes 20 are formed with grooves 161h and 161h for a later explained swing axis 169b of latches 169 and 169' to be held therein and concave portions 161i and 161i for the coil springs 168 and 168 for biasing the latches 169 and 169' to be held therein.

In the insert body 161', concave portions 161d and 161d' are formed on two sidewall portions 192 and 192' in parallel in the longitudinal direction of the insert body 161' among sidewall portions surrounding the IC housing part 19. At a lower end portion of one sidewall portion 192' serves as a contact portion 195 for the side surface of an IC device 2 housed in the IC housing part 19 to contact.

The concave portion 161d formed on the insert body 161' is to hold the center portion of the latch 169, and the concave portion 161d' is to hold the center portion of the latch 169'.

The latch 169 comprises two swing arms 169a and 169a arranged in parallel to each other between the IC housing part 19 and the respective guide holes 20 at the upper portion of the insert body 161', and a body part 169d for connecting one end portions of the swing arms 169a and 169a (end portions on the side of the sidewall portion 192 of the IC housing part 19) and drooping to the lower portion of the IC housing part 19.

On the outer side of the center portion of each of the swing arm 169a is formed a swing axis 169b to be a swing supporting point, and at the upper side of the other end portion of the swing arm 169a (an opposite end portion from the end portion connected to the body part 169d) serves as a contact portion 169c for the lower surface of the drive plate 162 to contact.

On the IC housing part 19 side of the drooping portion of the body part 169d, a suppressing portion 169e for suppressing the upper surface of the IC device 2 housed in the IC housing part 19 is formed. On the lower side of the drooping portion of the body part 169d is formed a pressing portion 169f for pressing the IC device 2 against the contact portion 195 of the sidewall portion 192' in a way of contacting the side surface of the IC device 2 housed in the IC housing part 19.

On the other hand, the latch 169' has the same configuration as that of the above latch 169 except that the pressing portion 169f is not formed.

The swing axes 169b of the latch 169 and the latch 169' are held in the grooves 161h respectively formed on the insert body 161', and the drooping portions of the body parts 169d of the latch 169 and the latch 169' are held in the concave portion 161d and the concave portion 161d'. At this time, on the lower side of the contact portions 169c of the swing arms 169a of the latch 169 and the latch 169', coil springs 168 held in the concave portions 161i of the insert body 161' are provided, and the coil springs 168 bias the contact portions 169c of the swing arms 169a of the latch 169 and the latch 169' upward.

As shown in FIG. 14, the drive plate 162 can elastically move up and down by the coil springs 163, and when the drive plate 162 moves up and down, the latch 169 and the latch 169' are interlocked with that to swing about the swing axes 169b.

In such an insert 16', in a state with no load as shown in FIG. 14(a), the drive plate 162 positions on the upper side, and the suppressing portion 169e and the pressing portion 169f of the latch 169 and the suppressing portion 169e of the latch 169' are out to the IC housing part 19.

As shown in FIG. 14(b), when the drive plate 162 of the insert 16' moves downward, the contact portions 169c of the swing arms 169a of the latch 169 and the latch 169' are pressed downward by the lower surface of the drive plate 162 to move downward. Along therewith, the swing arms 169a swing about the swing axes 169b, and the suppressing portions 169e formed on the IC housing part 19 side of the drooping portions of the body parts 169d recede from the IC housing part 19. In the latch 169, the pressing portion 169f together with the suppressing portion 169*e* recedes from the IC housing part 19. The IC device 2 is housed in the IC housing part 19 in this state.

As shown in FIG. 14(*c*), when the drive plate 162 of the insert 16' moves upward, the contact portions 169*c* of the swing arms 169*a* of the latch 169 and the latch 169' are biased by the coil springs 168 and move upward. Along therewith, the swing arms 169*a* swing about the swing axes 169*d* and the suppressing portions 169*e* formed on the IC housing part 19 side of the drooping portions of the body parts 169*d* go out to the IC housing part 19. The suppressing portions 169*e* being out in the IC housing part 19 can suppress the upper surface of the IC device 2 housed in the IC housing part 19.

In the latch 169, the pressing portion 169*f* together with the suppressing portion 169*e* goes out to the IC housing part 19. The pressing portion 169*f* being out in the IC housing part 19 contacts the side surface of the IC device 2 housed in the IC housing part 19 and presses the IC device 2 against the contact portion 195 of the sidewall portion 192'.

In the above explained insert 16', even in the case where an IC device 2 formed to have small outer dimensions by an error is housed in the IC housing part 19, the IC device 2 is pressed against the contact portion 195 of the sidewall portion 192' of the IC housing part 19 so as not to play therein. Therefore, the external terminals 2B are brought to surely contact with the probe pins 51 as far as it is an IC device 2 within a normal error range (IC device 2 with no excessive errors in dimensions from the device side surface for contacting the contact portion 195 to the external terminals 2B). Accordingly, it is possible to decrease arising of contact errors due to alignment deviation between the external terminals 2B of the IC device 2 and the probe pins 51, abnormal deformation of the external terminals 2B, bending and breaking of the probe pins 51, etc caused by the probe pins 51 sticking positions deviated from the center of the external terminals 2B. Particularly, in an IC device 2 having a large tolerance in dimensions from one side surface to the external terminals 2B, by bringing an opposing side surface of the side surface contact with the contact portion 195 of the sidewall portion 192' in the IC housing part 19, it is possible to efficiently decrease arising of contact errors, abnormal deformation of the external terminals 2B, bending and breaking of the probe pins 51, etc.

INDUSTRIAL APPLICABILITY

As explained above, according to an insert, tray or an electronic device handling apparatus of the present invention, it is possible to decrease arising of contact errors of an electronic device to be tested, abnormal deformation of the external terminals and breaking of the contact portion, etc. Namely, the insert, tray or the electronic device handling apparatus of the present invention is particularly useful for surely conducting tests on a compact electronic device having external terminals with narrow pitches.

The invention claimed is:

1. An insert for housing an electronic device to be tested brought to be electrically connected to a contact portion of a test head in an electronic device handling apparatus, the electronic device comprises a plate-like package body, the package body has a first major surface provided with external terminals, a second major surface which is opposite to the first major surface, and a minor surface being a side surface between the first major surface and the second major surface, the insert comprising:

an insert body formed with an electronic device housing part for housing the electronic device to be tested and having a contact portion configured to contact the side surface of the electronic device to be tested housed in said electronic device housing part;

a pressing member capable of pressing the electronic device to be tested which is housed in said electronic device housing part against the contact portion of said insert body; and a drive being allowed to move up and down attached to said insert body;

wherein said pressing member is receded from said electronic device housing part at the time of introducing the electronic device into said electronic device housing part and goes out to said electronic device housing part after the electronic device to be tested is housed in said electronic device housing part, and said pressing member being allowed to swing is attached to said insert body, which swings to recede from said electronic device housing part or to go out to said electronic device housing part along with a downward move or an upward move of said drive, said pressing member is configured to help align the external terminals of the electronic device in a proper position to contact the contact portion of the test head.

2. The insert as set forth in claim 1, wherein said pressing member comprises a swing arm having a swing axis to be a swing supporting point and a drive contact portion for said drive to contact;

a body part extending to said electronic device housing part and connected to said swing arm on the opposite side of said drive contact portion over said swing axis; and a pressing portion provided to said body part and for pressing the electronic device to be tested against the contact portion of said insert body by contacting with the electronic device to be tested housed in said electronic device housing part.

3. An insert for housing an electronic device to be tested brought to be electrically connected to a contact portion of a test head in an electronic device handling apparatus, the electronic device comprises a plate-like package body, the package body has a first major surface provided with external terminals, a second major surface which is opposite to the first major surface, and a minor surface being a side surface between the first major surface and the second major surface, the insert comprising:

an insert body formed with an electronic device housing part for housing the electronic device to be tested and having a contact portion configured to contact the side surface of the electronic device to be tested housed in said electronic device housing part;

a pressing member capable of pressing the electronic device to be tested which is housed in said electronic device housing part against the contact portion of said insert body; and a drive being allowed to move up and down attached to said insert body;

wherein said pressing member is receded from said electronic device housing part at the time of introducing the electronic device into said electronic device housing part and goes out to said electronic device housing part after the electronic device to be tested is housed in said electronic device housing part, said pressing member being allowed to move in parallel in the planar direction is attached to said insert body, which moves in parallel to recede from said electronic device housing part or to go out to said electronic device housing part along with a downward move or an upward move of said drive, and a long hole is formed on the pressing member, the long hole gradually approaches to said electronic device housing part as approaching the test head, and said drive is provided with a pin to be inserted, being allowed to slide, to the long hole of said pressing member, said pressing member is configured to help align the external terminals of the electronic device in a proper position to contact the contact portion of the test head.

4. The insert as set forth in claim 1 or 3 wherein said insert body is provided with an elastic body for biasing said pressing member in the direction that said pressing member goes out to said electronic device housing part.

5. The insert as set forth in claim 1 or 3, wherein said pressing member comprises an electronic device suppressing portion being capable of suppressing an upper surface of the electronic device to be tested housed in said electronic device housing part.

6. The insert as set forth in claim 1 or 3, wherein said pressing member is provided on one side of said electronic device housing part in said insert body.

7. The insert as set forth in claim 1 or 3 , wherein said pressing member is provided on adjacent two sides of said electronic device housing part in said insert body.

8. The insert as set forth in claim 6, wherein an opposing side of said pressing member of said electronic device housing part in said insert body is provided with an electronic device suppressing member capable of suppressing an upper surface of the electronic device to be tested by receding from said electronic device housing part at the time of introducing the electronic device to be tested into said electronic device housing part and going out to said electronic device housing part after the electronic device to be tested is housed in said electronic device housing part.

9. A tray for conveying an electronic device to be tested to a contact portion of a test head connected to an electronic device handling apparatus, comprising the insert as set forth in claim 1 or 3.

10. An electronic device handling apparatus for handling an electronic device to be tested and bringing terminals of the electronic device to be tested electrically contact with a contact portion of a test head, comprising the insert as set forth in claim 1 or 3.

11. An electronic device handling apparatus for handling an electronic device to be tested and bringing terminals of the electronic device to be tested electrically contact with a contact portion of a test head, comprising the tray as set forth in claim 9.

12. The insert as set forth in claim 7, wherein an opposing side of said pressing member of said electronic device housing part in said insert body is provided with an electronic device suppressing member capable of suppressing an upper surface of the electronic device to be tested by receding from said electronic device housing part at the time of introducing the electronic device to be tested into said electronic device housing part and going out to said electronic device housing part after the electronic device to be tested is housed in said electronic device housing part.

* * * * *